United States Patent
Mackie et al.

(10) Patent No.: US 12,512,307 B2
(45) Date of Patent: Dec. 30, 2025

(54) PROFILE TWISTING CONTROL IN DIELECTRIC ETCH

(71) Applicant: Lam Research Corporation, Fremont, CA (US)

(72) Inventors: Neil Macaraeg Mackie, Fremont, CA (US); Kevin Lai, San Jose, CA (US); Chen Li, San Jose, CA (US); He Zhang, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 486 days.

(21) Appl. No.: 18/013,493

(22) PCT Filed: Jun. 16, 2022

(86) PCT No.: PCT/US2022/033784
§ 371 (c)(1),
(2) Date: Dec. 28, 2022

(87) PCT Pub. No.: WO2022/271526
PCT Pub. Date: Dec. 29, 2022

(65) Prior Publication Data
US 2024/0105432 A1    Mar. 28, 2024

Related U.S. Application Data

(60) Provisional application No. 63/213,010, filed on Jun. 21, 2021.

(51) Int. Cl.
*H01J 37/32* (2006.01)

(52) U.S. Cl.
CPC .... *H01J 37/3299* (2013.01); *H01J 37/32449* (2013.01); *H01J 37/3266* (2013.01);
(Continued)

(58) Field of Classification Search
CPC ........... H01J 37/32091; H01J 37/32449; H01J 37/3266; H01J 37/32926; H01J 37/32935;
(Continued)

(56) References Cited

U.S. PATENT DOCUMENTS

| 2007/0108042 A1* | 5/2007 | Hogenson | H01J 37/3266 |
| | | | 204/192.1 |
| 2012/0302065 A1 | 11/2012 | Lin et al. | |
| 2016/0013035 A1 | 1/2016 | Kim et al. | |

FOREIGN PATENT DOCUMENTS

| JP | 2024524964 | 7/2024 |
| KR | 20150063304 A | 6/2015 |

(Continued)

OTHER PUBLICATIONS

"International Application Serial No. PCT US2022 033784, International Preliminary Report on Patentability mailed Jan. 4, 2024", 6 pgs.

(Continued)

*Primary Examiner* — Benjamin Kendall
(74) *Attorney, Agent, or Firm* — Schwegman Lundberg & Woessner, P.A.

(57) ABSTRACT

A substrate processing apparatus includes a vacuum chamber with upper and lower electrodes and a processing zone for processing a substrate using plasma. The upper electrode includes a surface that is substantially parallel to a surface of the substrate when the substrate is positioned in the chamber. The apparatus includes at least one magnetic field source configured to generate one or more active magnetic fields through the processing zone, and a controller coupled to the at least one magnetic field source and the upper electrode. The controller is configured to apply RF power between the upper and lower electrodes to generate the plasma using a process gas. The controller controls the current through the at least one magnetic field source during the processing of (Continued)

the substrate, where the current is based on a target value corresponding to at least one characteristic of the one or more active magnetic fields.

15 Claims, 16 Drawing Sheets

(52) U.S. Cl.
CPC ... *H01J 37/32926* (2013.01); *H01J 37/32091* (2013.01); *H01J 2237/24564* (2013.01)

(58) Field of Classification Search
CPC ........ H01J 37/3299; H01J 2237/24564; H05H 1/04–14
See application file for complete search history.

(56) References Cited

FOREIGN PATENT DOCUMENTS

| WO | WO-2020126531 A1 | 6/2020 |
| WO | 2022271526 | 12/2022 |

OTHER PUBLICATIONS

International Application Serial No. PCT/US2022/033784, International Search Report mailed Oct. 17, 2022, 4 pgs.
International Application Serial No. PCT/US2022/033784, Written Opinion mailed Oct. 17, 2022, 4 pgs.

* cited by examiner

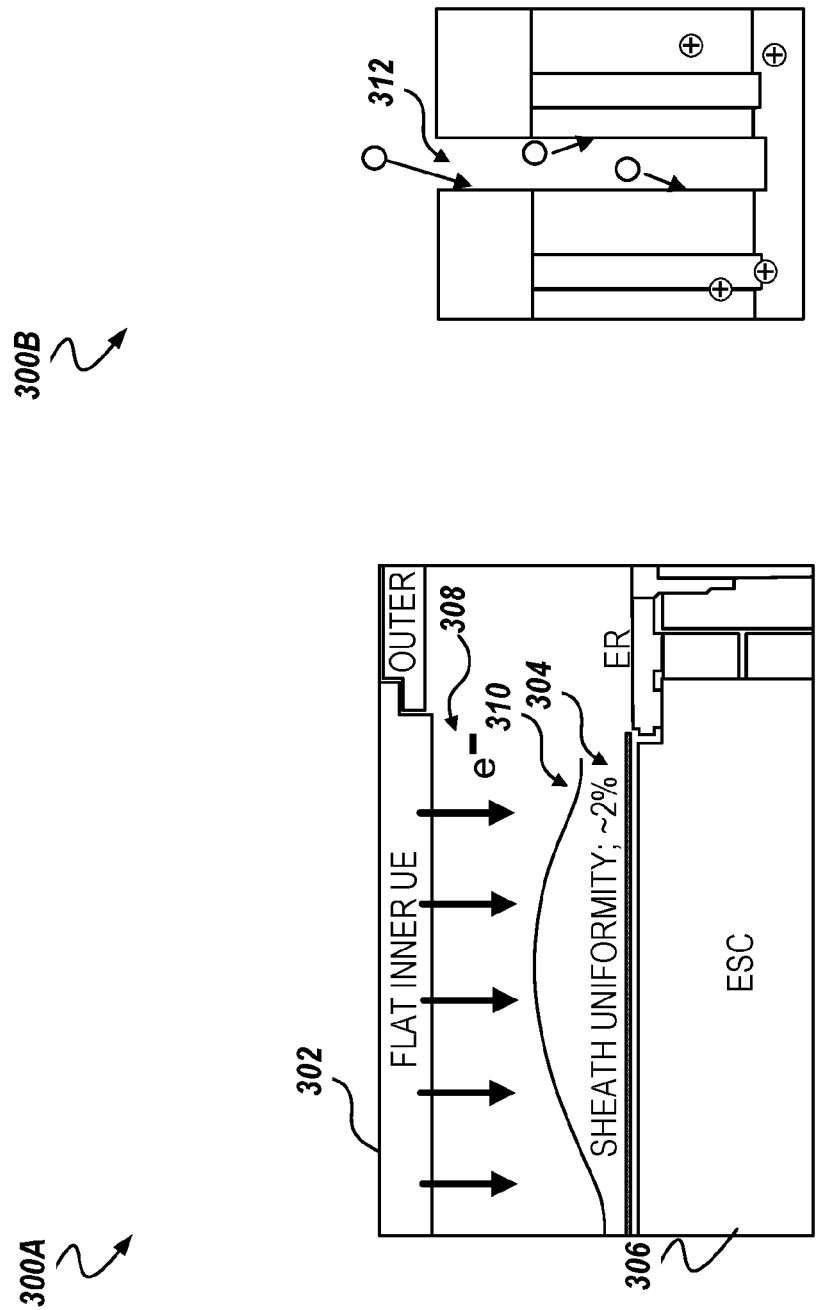

| RECIPE ID | X1001 | X1010 | X1020 |
|---|---|---|---|
| BASELINE REFERENCE | FLAT UE (-378)/20LET/SF6 (BLOCK B/C) | | |
| SPLIT CONDITIONS | MAGN. FLD SOURCE (MFS): 0A | MFS: 4A | MFS: 8A |
| | | | |
| PROF TWISTING: SYS | 5.31 | 3.36 | 2.41 |
| PROF TWISTING: RAN | 1.72 | 2.01 | 1.98 |

FIG. 8

PROFILE TWISTING CONTROL IN DIELECTRIC ETCH

CLAIM OF PRIORITY

This application is a U.S. National Stage Filing under 35 U.S.C. 371 from International Application No. PCT/US2022/033784, filed on Jun. 16, 2022, which claims the benefit of priority to U.S. Patent Application Ser. No. 63/213,010, filed on Jun. 21, 2021, each of which is incorporated by reference herein in its entirety.

TECHNICAL FIELD

The subject matter disclosed herein generally relates to methods, systems, and machine-readable storage media for profile twisting control in dielectric etch processes, such as high-aspect ratio dielectric etch processes during plasma-based substrate manufacturing (e.g., capacitively coupled plasma (CCP) or inductively coupled plasma (ICP) substrate manufacturing).

BACKGROUND

Semiconductor substrate processing systems are used to process semiconductor substrates by techniques including etching, physical vapor deposition (PVD), chemical vapor deposition (CVD), plasma-enhanced chemical vapor deposition (PECVD), atomic layer deposition (ALD), plasma-enhanced atomic layer deposition (PEALD), pulsed deposition layer (PDL), plasma-enhanced pulsed deposition layer (PEPDL), and resist removal. One type of semiconductor substrate processing apparatus is a plasma processing apparatus using CCP that includes a vacuum chamber containing upper and lower electrodes, where a radio frequency (RF) power is applied between the electrodes to excite a process gas into plasma for processing semiconductor substrates in the reaction chamber. Another type of semiconductor substrate processing apparatus is an ICP processing apparatus.

In semiconductor substrate processing systems, such as the CCP-based or ICP-based vacuum chambers for manufacturing substrates, etch uniformity and global ion tilt at the substrate surface are influenced by plasma density uniformity. In such semiconductor substrate processing systems, slit etch is one of the final steps in the dielectric etch workflow and thus can be associated with very tight critical dimension (CD) tolerances to prevent interaction (clipping) of existing features such as memory holes. Slit profile twisting, which can be described as a non-ideal profile shape where one or more profile direction changes can occur, is a consideration, especially for high aspect ratio (HAR), etch of 3D NAND slit features. Twisted profiles can occur along an entire slit or in localized areas of the structure or die. Additionally, twisted profiles are associated with larger than expected non-compliance with CD tolerances as well as a risk for clipping of existing features, which are not desirable outcomes during semiconductor substrate manufacturing.

The background description provided herein is to generally present the context of the disclosure. It should be noted that the information described in this section is presented to provide the skilled artisan some context for the following disclosed subject matter and should not be considered as admitted prior art. More specifically, work of the presently named inventors, to the extent it is described in this background section, as well as aspects of the description that may not otherwise qualify as prior art at the time of filing, are neither expressly nor impliedly admitted as prior art against the present disclosure.

SUMMARY

Methods, systems, and computer programs stored as instructions on machine-readable media are presented for processing a substrate within a vacuum chamber. One general aspect includes a substrate processing apparatus. The apparatus includes a vacuum chamber with a processing zone for processing a substrate using plasma. The apparatus further includes an upper electrode. The upper electrode is disposed within the vacuum chamber and includes a surface that is generally parallel to a surface of the substrate. The apparatus further includes at least one magnetic field source configured to generate one or more active magnetic fields through the processing zone of the vacuum chamber. The apparatus further includes a controller coupled to the at least one magnetic field source and the upper electrode. The controller is configured to apply RF power between the upper electrode and a lower electrode of the vacuum chamber to generate the plasma within the processing zone using a process gas. The controller is further configured to control current through the at least one magnetic field source during the processing of the substrate. The current is based on a target value corresponding to at least one characteristic of the one or more active magnetic fields.

Another general aspect includes a method of processing a substrate in a vacuum chamber. The method includes supplying a process gas within a processing zone of the vacuum chamber. The method further includes applying RF power between an upper electrode and a lower electrode of the vacuum chamber to generate plasma within the processing zone using the process gas. The upper electrode includes a surface that is parallel to a surface of the substrate. The method further includes applying current through at least one magnetic field source to generate one or more active magnetic fields through the processing zone of the vacuum chamber. The method further includes controlling the current through the at least one magnetic field source during the processing of the substrate. The current is based on a target value corresponding to at least one characteristic of the one or more active magnetic fields.

An additional general aspect includes a non-transitory machine-readable storage medium including instructions that, when executed by a machine, cause the machine to perform operations for processing a substrate in a vacuum chamber. The operations include supplying a process gas within a processing zone of the vacuum chamber. The operations further include applying RF power between an upper electrode and a lower electrode of the vacuum chamber to generate plasma within the processing zone using the process gas. The upper electrode includes a surface that is parallel to a surface of the substrate. The operations further include applying current through at least one magnetic field source to generate one or more active magnetic fields through the processing zone of the vacuum chamber. The operations further include controlling the current through the at least one magnetic field source during the processing of the substrate, the current based on a target value corresponding to at least one characteristic of the one or more active magnetic fields.

BRIEF DESCRIPTION OF THE DRAWINGS

Various ones of the appended drawings merely illustrate example embodiments of the present disclosure and cannot be considered as limiting its scope.

FIG. 3A illustrates a vacuum chamber using a flat upper electrode resulting in sheath non-uniformity, according to some example embodiments.

FIG. 3B illustrates ion incidence angles (or ion tilt) associated with the vacuum chamber of FIG. 3A, according to some example embodiments.

FIG. 8 is a diagram illustrating the improvement of slit profile twisting in relation to changes of magnetic field source current, according to some example embodiments.

DETAILED DESCRIPTION

Figure 1:
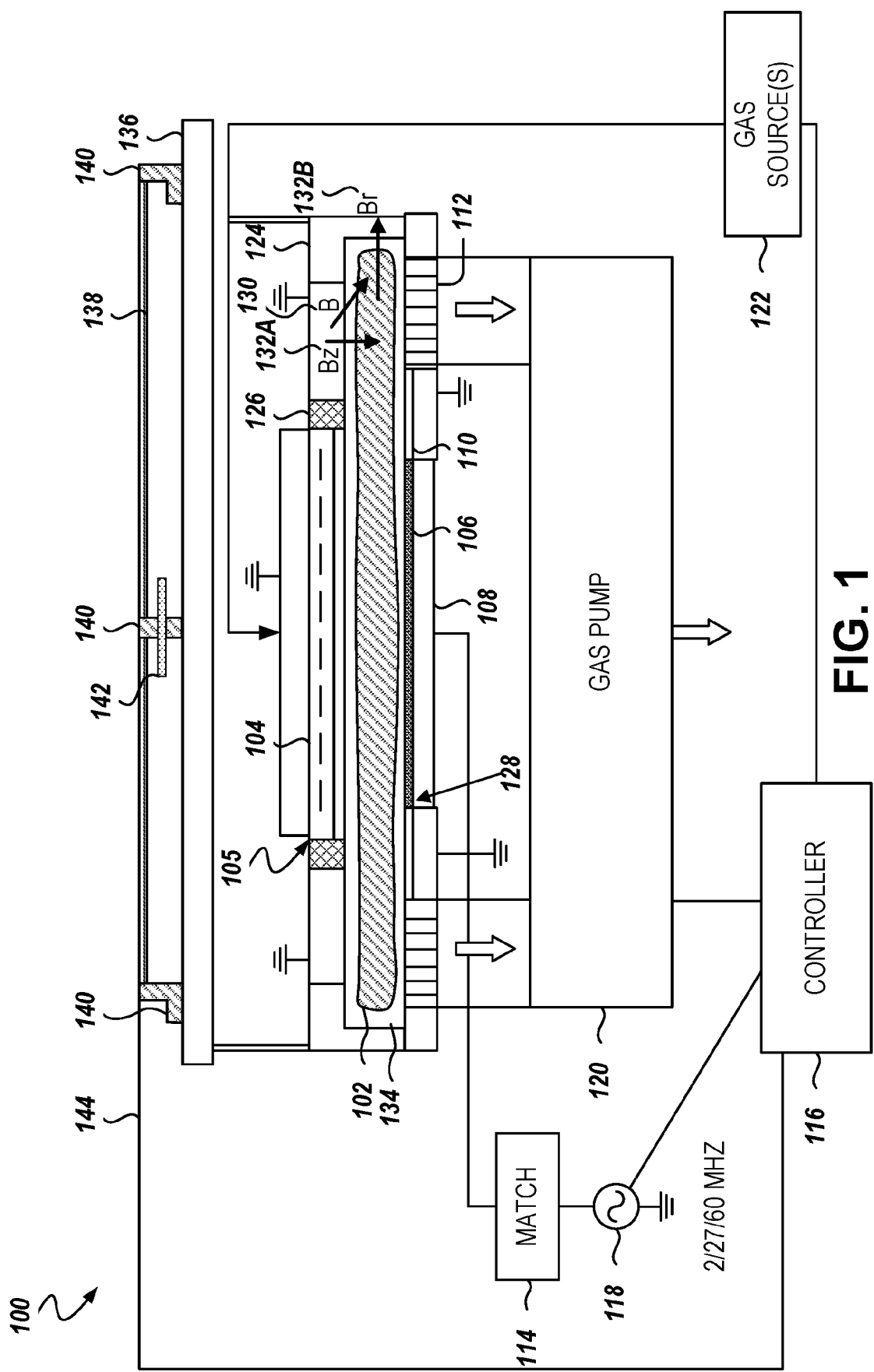
FIG. 1 illustrates a vacuum chamber, such as an etching chamber, for manufacturing substrates, according to some example embodiments.

Example methods, systems, and computer programs are directed to controlling slit profile twisting in substrate manufacturing equipment using a flat upper electrode and at least one magnetic field source. Examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

The twisting of substrate slit profiles is associated with a non-ideal profile shape where one or more profile direction changes occur. Since twisted profiles have larger than expected non-compliance with CD tolerances and can occur along an entire slit or in localized areas of a structure or die, there is a risk of clipping of existing features during substrate manufacturing (e.g., during a high aspect ratio etch of 3D NAND slit features).

Two distinct mechanisms may cause twisting—random twisting and systematic twisting. In random twisting, differential etch rates of a cyclical process or non-ideal etch front profiles result in random directional changes. In systematic twisting, non-ideal incoming ion trajectories result in repeating twisting profiles across multiple slit features through in-feature charging and ion scattering mechanisms. In this regard, random twisting results from etch process differences (e.g., process-driven), and systematic twisting results from non-ideal ion angular distribution (e.g., ion-driven).

The techniques disclosed herein are associated with mitigating systematic twisting during substrate manufacturing processes (e.g., during dielectric etch processes including HAR dielectric etch processes). More specifically, a tunable magnetic field source is used during a substrate manufacturing process to modify plasma density uniformity as a means to improve sheath uniformity and provide more ideal incoming ion trajectories that can minimize systematic slit twisting defects. Additionally, the magnetic field source may be used in connection with vacuum chambers with a flat upper electrode where uniform secondary electron generation in a combination of uniform ion trajectories can be realized to minimize systematic twisting in HAR dielectric etch through increased surface charge neutralization. The disclosed techniques may be used in connection with mitigating systematic twisting during substrate manufacturing processes including dielectric etch processes resulting in slits, trenches, holes, and/or any other HAR dielectric etch processes.

Example techniques for adjusting plasma density uniformity include zonal flow distribution, electrode gap, pressure, and power delivery. Many of these techniques, however, are associated with significant trade-offs for rate uniformity, CD uniformity, and overall CD control in feature. Another technique to adjust plasma density uniformity is to "shape" the upper electrode (e.g., one or more surfaces of the upper electrode are curved and are non-parallel with a surface of the substrate). A shaped upper electrode may be an effective method to adjust plasma density uniformity but process changes interact with the electrode shape resulting in multiple cycles of electrode design and process optimization that are time-consuming and expensive (e.g., associated with parts replacement). In addition, a shaped electrode can also detune secondary electron generation resulting in increased charging for HAR slit feature applications, which contributes to slit profile twisting.

The disclosed techniques can be used to improve plasma density uniformity that can maintain high secondary electron yields and enable independent tunability with other process knobs without electrode design changes. In this regard, the disclosed techniques may be used to enable larger process windows to reduce systematic slit twisting across the substrate by reducing charging while simultaneously enabling normal ion trajectories in the slit feature. In some embodiments, the disclosed techniques include the use of a combination of a vacuum chamber with a flat (non-shaped) upper electrode and a tunable magnetic field source (e.g., disposed externally to the plasma volume) for generating one or more active magnetic fields.

Without the use of a magnetic field source, a flat upper electrode results in non-uniform plasma density and ion trajectory with uniform secondary electron generation. By adding a magnetic field source to the vacuum chamber, the plasma density can be tuned independently of process gas flow, pressure, power, or electrode gap to generate ideal ion trajectories that work cooperatively with secondary electrons to significantly reduce systematic twisting.

Normal ion trajectories with sufficient secondary electron production are used to minimize substrate charging as the slit feature aspect ratio for 3D NAND devices continues to increase. The disclosed techniques enable co-optimization of the electromagnetic field strength in combination with other traditional process knobs for plasma density uniformity control, resulting in faster speed to solution for complex dielectric etches without hardware intervention.

As used herein, the term "flat electrode" refers to a vacuum chamber electrode (e.g., an upper electrode) that is non-shaped and includes at least one surface that is parallel to a surface of the substrate. As used herein, the term "shaped electrode" refers to a vacuum chamber electrode including at least one surface that is non-parallel to a surface of the substrate. As used herein, the term "axial magnetic field" indicates a magnetic field that is orthogonal to a surface of a substrate within a vacuum chamber. As used herein, the term "radial magnetic field" indicates a magnetic field that is parallel to a surface of the substrate within the vacuum chamber. The axial magnetic field and the radial magnetic field form a magnetic field which is also referred to herein as an "active field" or an "active magnetic field." In some aspects, a magnetic field controller (e.g., as discussed in connection with FIG. 1) may be used for managing individual radial or axial active magnetic fields, as well as a combination of both radial and axial active magnetic fields for improving plasma density uniformity (e.g., controlling plasma density across the entire surface of the substrate within the vacuum chamber of one or more substrate processing apparatuses such as CCP-based or ICP-based substrate processing apparatuses) in order to achieve desired sheath uniformity and provide more ideal incoming ion trajectories that can minimize systematic slit twisting defects.

Figure 2:
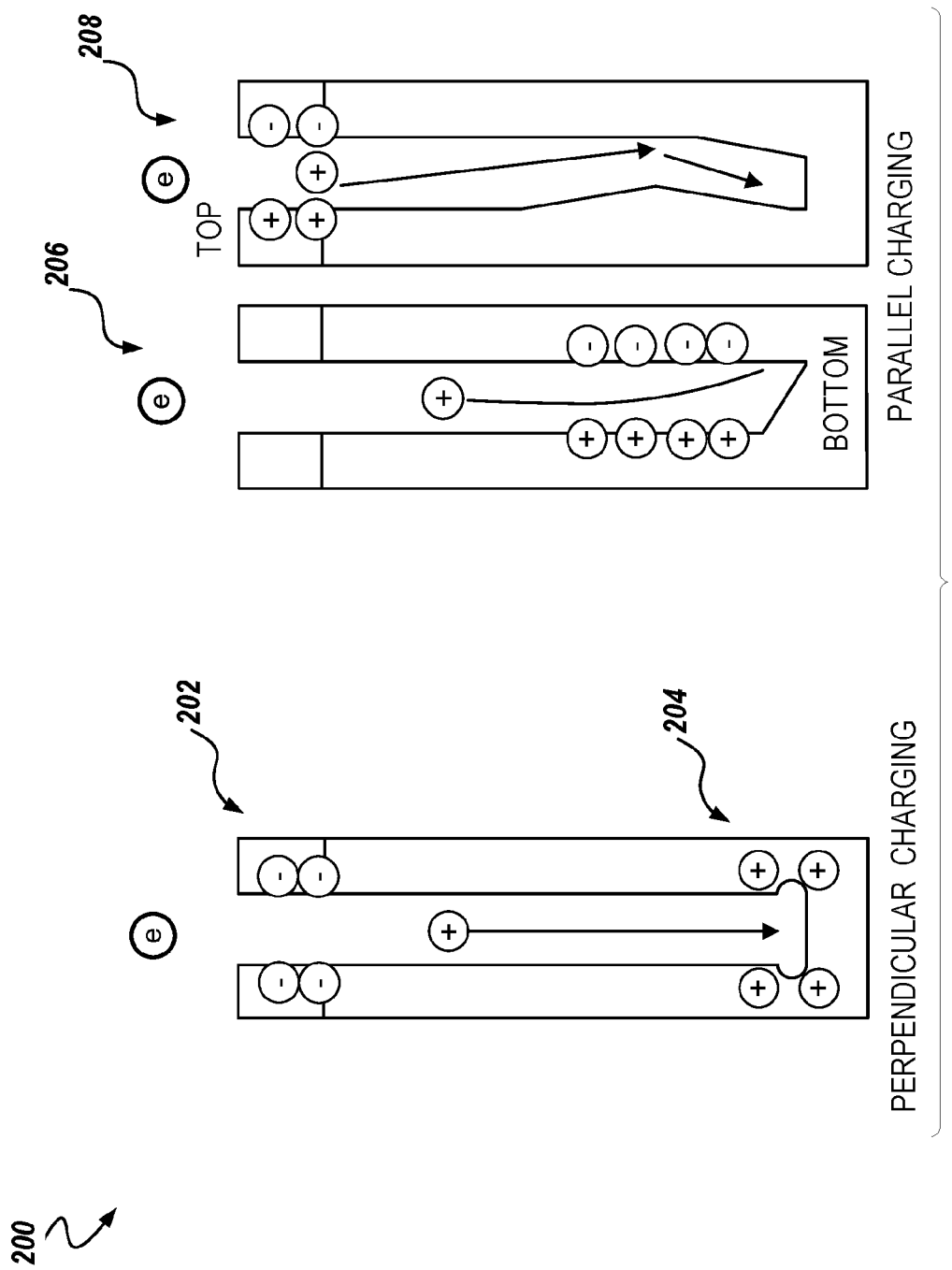
FIG. 2 illustrates different types of charging of substrate slit features, which can be mitigated using the disclosed techniques according to some example embodiments.
Figure 3C:
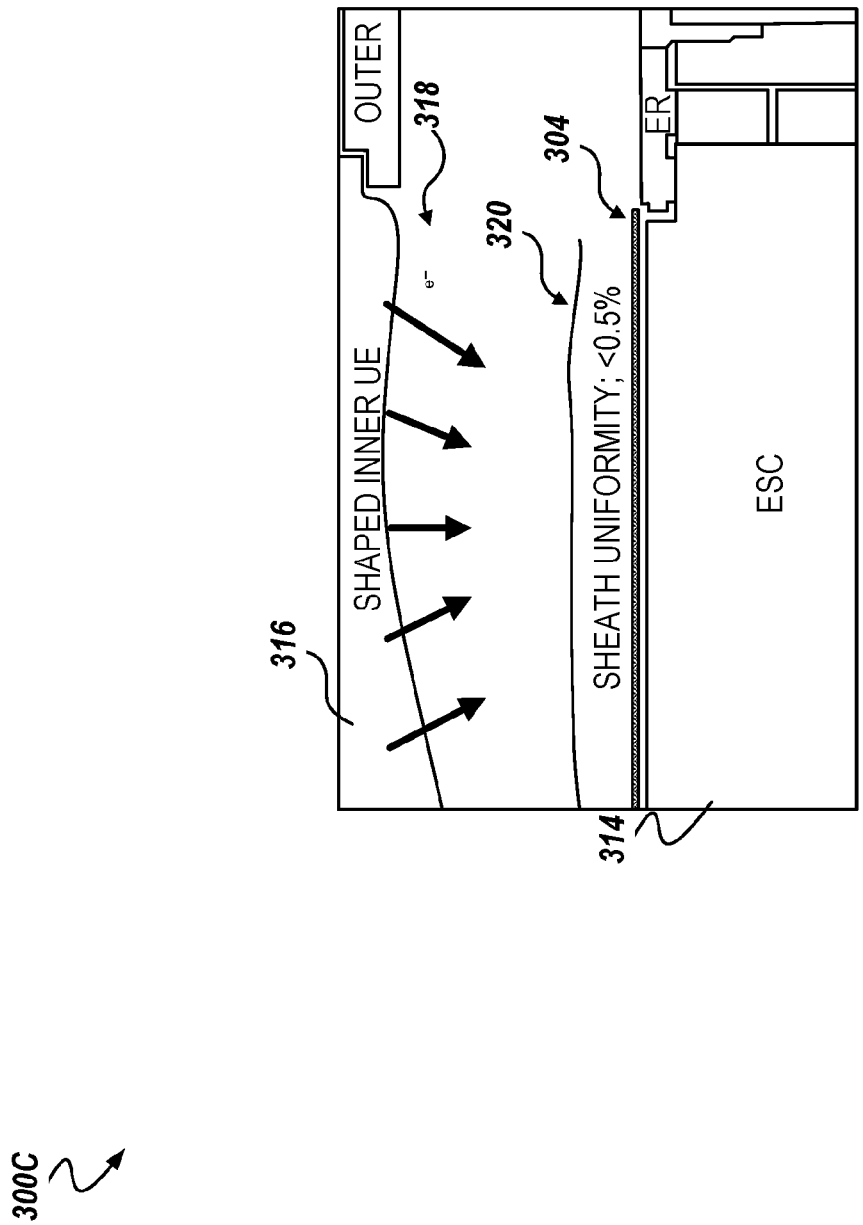
FIG. 3C illustrates a vacuum chamber using a shaped upper electrode resulting in sheath uniformity, according to some example embodiments.
Figure 9:
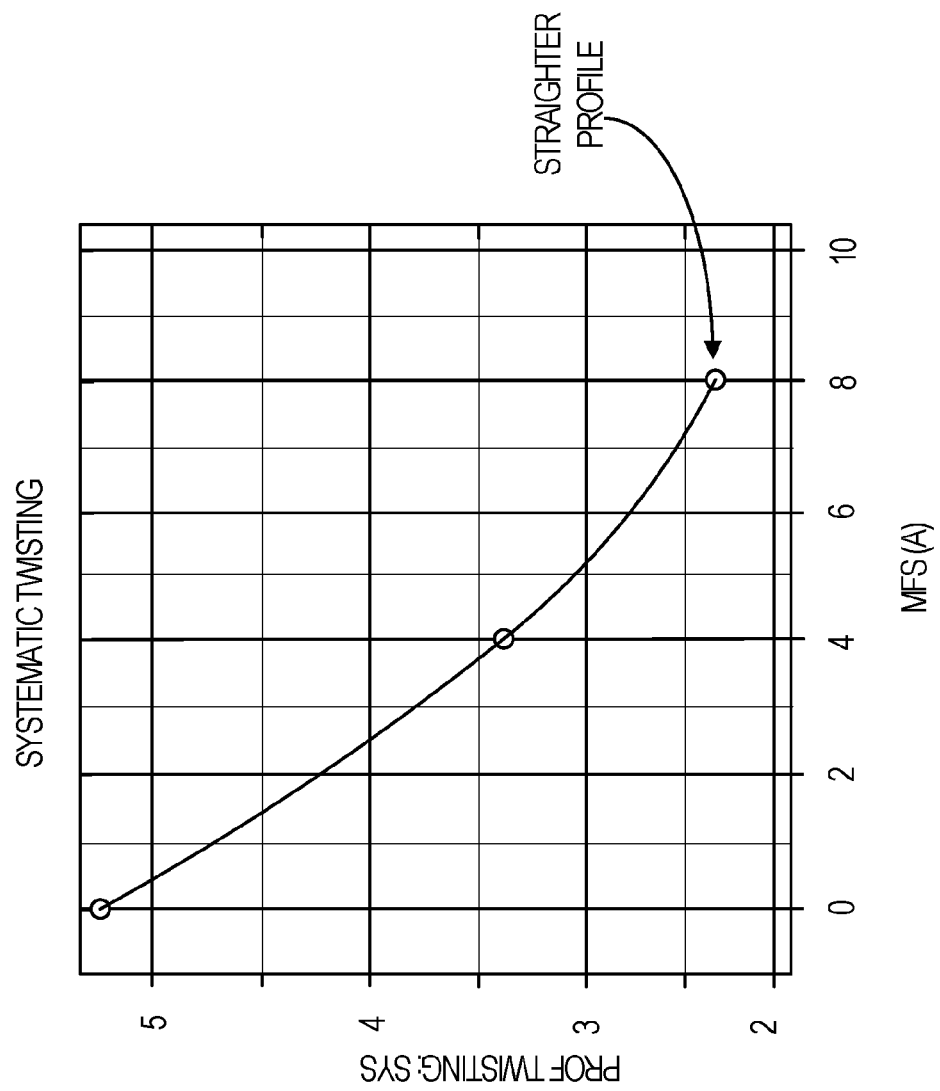
FIG. 9 illustrates a graph of systematic twisting in relation to magnetic field source current, according to some example embodiments.
Figure 11A:
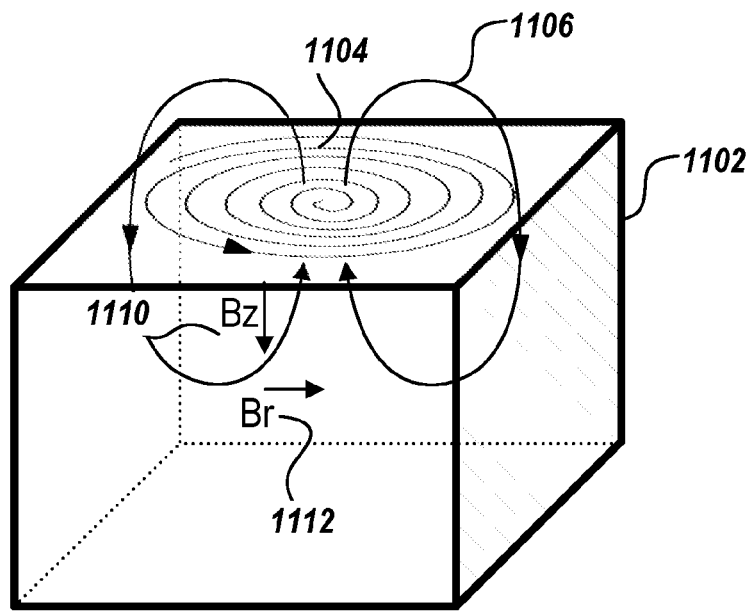
FIG. 11A illustrates a perspective view of a vacuum chamber with a coil used as a magnetic field source for generating an active magnetic field, according to some example embodiments.
Figure 12:
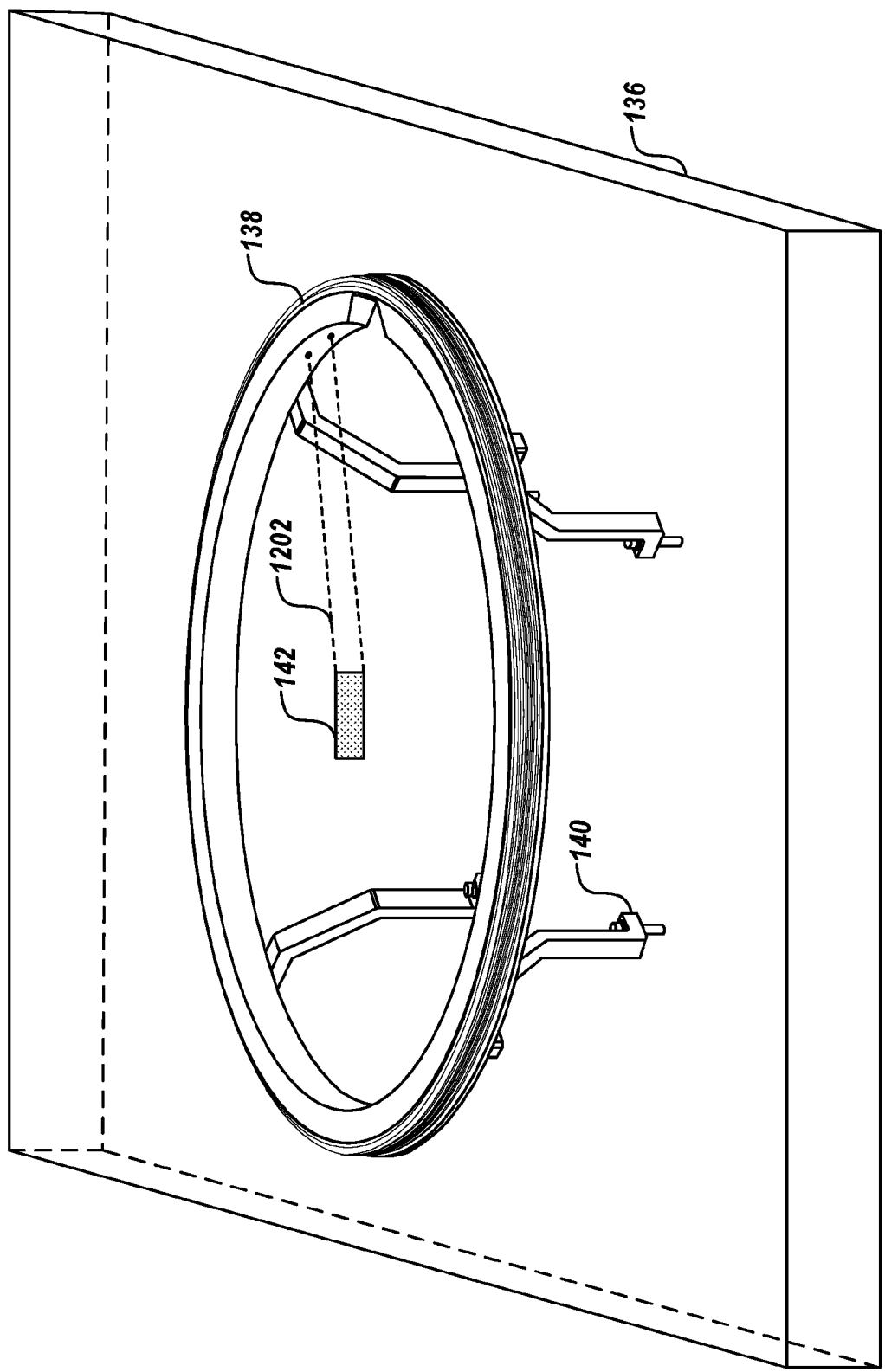
FIG. 12 illustrates an example magnetic field source mounted on a top plate of the vacuum chamber of FIG. 1, according to some embodiments.
Figure 13:
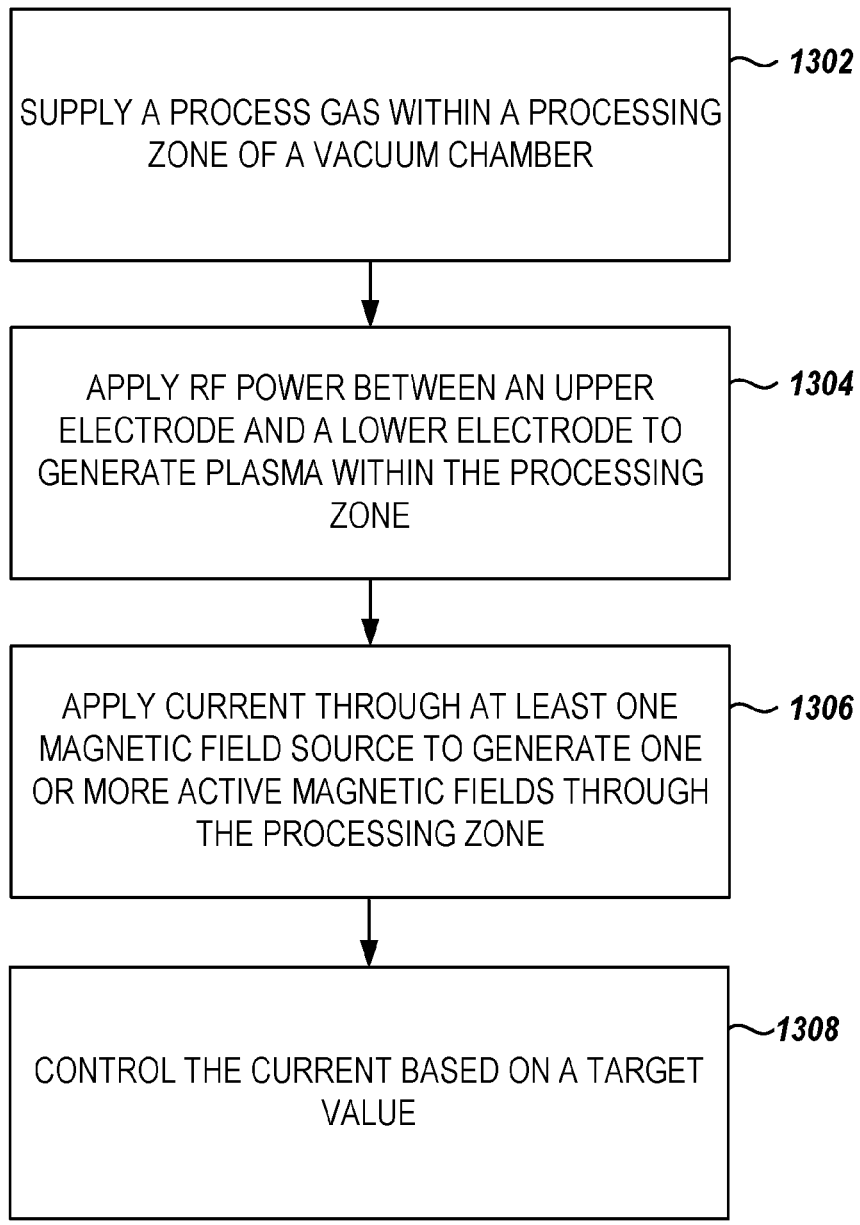
FIG. 13 is a flowchart of a method of processing a substrate in a vacuum chamber, according to some example embodiments.
Figure 14:
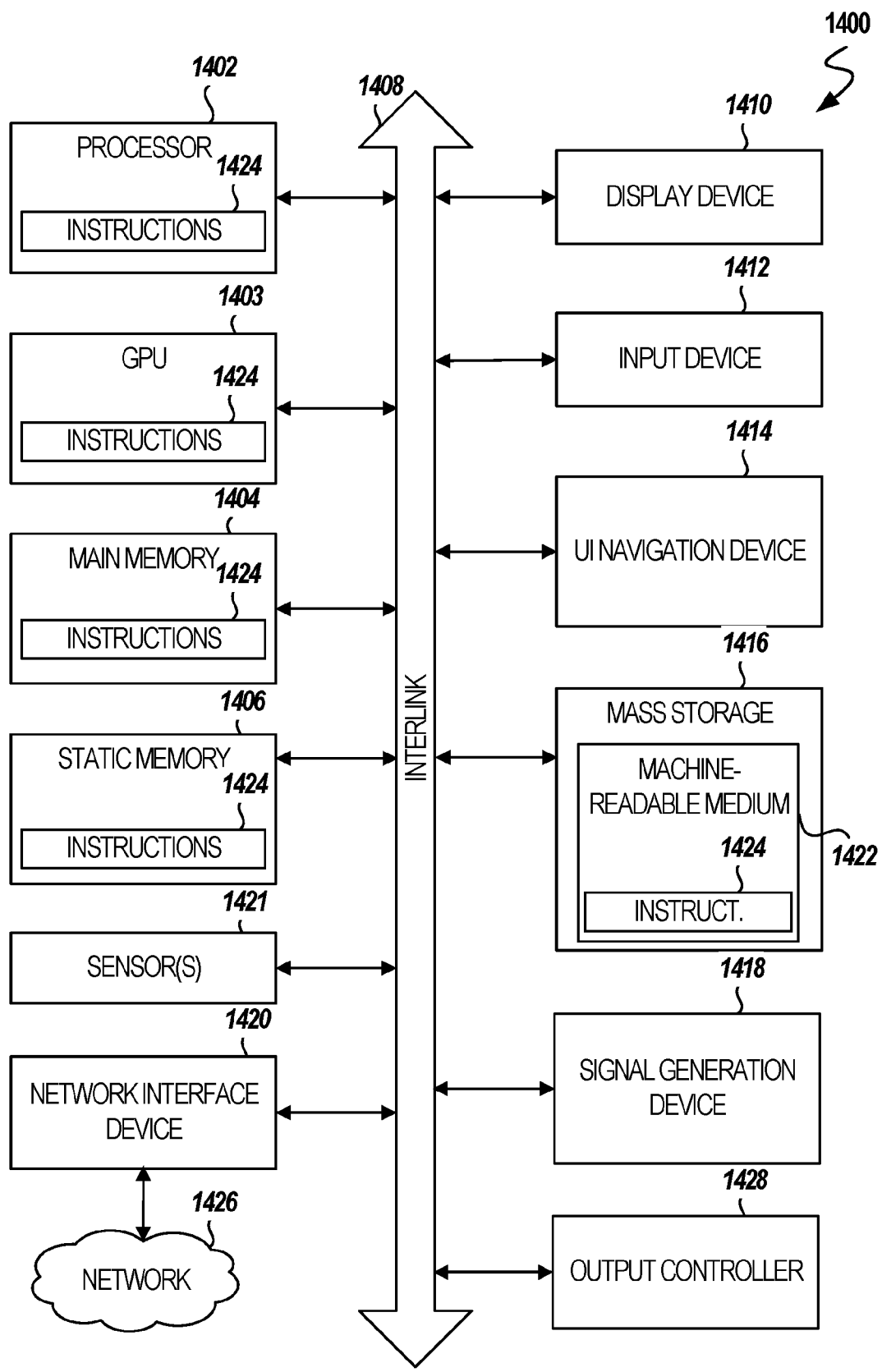
FIG. 14 is a block diagram illustrating an example of a machine upon which one or more example method embodiments may be implemented, or by which one or more example embodiments may be controlled.

Example vacuum chambers using the disclosed techniques are discussed in connection with FIG. 1 and FIG. 7. FIG. 13 provides an example flow chart of a method for substrate processing using such techniques, and FIG. 14 illustrates an example device that may be used in connection with the disclosed techniques. FIG. 2 illustrates different types of charging, which may be mitigated using the disclosed techniques. FIGS. 3A-3C illustrate the effects of changing the shape of the upper electrode on sheath uniformity, with related graphs illustrated in FIGS. 4A-6B. FIG. 8 and FIG. 9 illustrate the effects of the disclosed techniques of using a flat upper electrode in combination with a magnetic field source in reducing systematic twisting. FIGS. 10-12 illustrate different embodiments of the magnetic field source, which can be used in connection with the disclosed techniques.

FIG. 1 illustrates a vacuum chamber 100 (e.g., an etching chamber) for manufacturing substrates, according to one embodiment. Exciting an electric field between two electrodes is one of the methods to obtain radio frequency (RF) gas discharge in a vacuum chamber. When an oscillating voltage is applied between the electrodes, the discharge obtained is referred to as a CCP discharge.

Plasma 102 may be created utilizing stable feedstock gases to obtain a wide variety of chemically reactive by-products created by the dissociation of the various molecules caused by electron-neutral collisions. The chemical aspect of etching involves the reaction of the neutral gas molecules and their dissociated by-products with the molecules of the to-be-etched surface and producing volatile molecules, which can be pumped away. When a plasma is created, the positive ions are accelerated from the plasma across a space-charge sheath separating the plasma from chamber walls to strike the substrate surface with enough energy to remove material from the substrate surface. The process of using highly energetic and chemically reactive ions to selectively and anisotropically remove materials from a substrate surface is called reactive ion etch (RIE). The disclosed techniques improve RIE uniformity by controlling plasma density and sheath uniformity using axial and radial magnetic fields.

A controller 116 (also referred to as a magnetic field controller or MFC) manages the operation of the vacuum chamber 100 by controlling the different elements in the chamber, such as RF generator 118, gas sources 122, and gas pump 120. In one embodiment, fluorocarbon gases, such as $CF_4$ and $C_4F_8$, are used as process gasses in a dielectric etch process for their anisotropic and selective etching capabilities, but the principles described herein can be applied to other plasma-creating gases. The fluorocarbon gases are readily dissociated into chemically reactive by-products that include smaller molecular and atomic radicals. These chemically reactive by-products etch away the dielectric material.

The vacuum chamber 100 illustrates a processing chamber with a top (or upper) electrode (UE) 104 and a bottom (or lower) electrode 108. The upper electrode 104 may be grounded or coupled to an RF generator (not shown), and the lower electrode 108 is coupled to the RF generator 118 via a matching network 114. The RF generator 118 provides RF power in one or multiple (e.g., two or three) different RF frequencies. According to the desired configuration of the vacuum chamber 100 for a particular operation, at least one of the three RF frequencies may be turned on or off. In the embodiment shown in FIG. 1, the RF generator 118 is configured to provide, e.g., 400 kHz, 2 MHz, 27 MHz, and 60 MHz frequencies, but other frequencies are also possible. In some aspects, the lower electrode 108 is part of an electrostatic chuck (ESC) supporting substrate 106.

The vacuum chamber 100 includes a gas showerhead on the upper electrode 104 to input process gas provided by the gas source(s) 122 into the processing zone 134 of the vacuum chamber 100, and a perforated confinement ring 112 that allows the process gas to be pumped out of the vacuum chamber 100 by gas pump 120. In some example embodiments, the gas pump 120 is a turbomolecular pump, but other types of gas pumps may be utilized.

When substrate 106 is present in the vacuum chamber 100, silicon focus ring 110 is situated next to substrate 106 such that there is a uniform RF field at the bottom surface of the plasma 102 for uniform etching on the surface of the substrate 106. The embodiment of FIG. 1 shows a triode reactor configuration where the upper electrode 104 is surrounded by a symmetric RF ground electrode 124. Insulator 126 is a dielectric that isolates the ground electrode 124 from the upper electrode 104. Other implementations of the vacuum chamber 100, including ICP-based implementations, are also possible without changing the scope of the disclosed embodiments.

The substrate 106 can include, for example, wafers (e.g., having a diameter of 100 mm, 150 mm, 200 mm, 300 mm, 450 mm, or larger) and comprising, for example, elemental-semiconductor materials (e.g., silicon (Si) or germanium (Ge)) or compound-semiconductor materials (e.g., silicon germanium (SiGe) or gallium arsenide (GaAs)). Additionally, other substrates include, for example, dielectric materials such as quartz or sapphire (onto which semiconductor materials may be applied).

Each frequency generated by the RF generator 118 may be selected for a specific purpose in the substrate manufacturing process. In the example of FIG. 1, with RF powers provided at 400 kHz, 2 MHz, 27 MHz, and 60 MHz, the 400 kHz or 2 MHz RF power provides ion energy control, and the 27 MHz and 60 MHz powers provide control of the plasma density and the dissociation patterns of the chemistry. This configuration, where each RF power may be turned ON or OFF, enables certain processes that use ultra-low ion energy on the substrates or wafers, and certain processes (e.g., soft etch for low-k materials) where the ion energy has to be low (e.g., under 700 or 200 eV). Other processes that can be enabled using this configuration include processes that use ultra-high ion energy for HAR dielectric etch.

In some aspects, the vacuum chamber 100 uses a flat upper electrode 104, which includes at least one surface (e.g., surface 105) that is parallel to a surface (e.g., surface 128) of substrate 106. As illustrated in FIG. 3A and FIG. 3B, the use of a flat upper electrode results in non-uniform plasma density which causes a non-uniform sheath and non-normal ion trajectories in relation to substrate slit features. In an example embodiment, one or more active magnetic fields 130 may be introduced by at least one magnetic field source (e.g., magnetic field source 138 which may be a coil) to improve plasma density uniformity causing a uniform sheath and normal ion trajectories. The at least one magnetic field source may be configured, monitored, and controlled via the MFC 116. In some aspects, the one or more active magnetic fields may include one or more axial active magnetic fields 132A and one or more radial active magnetic fields 132B introduced within the processing zone 134 so that a magnitude of each of the one or more active magnetic fields (or a ratio of magnitudes of at least two active magnetic fields) reaches a pre-configured threshold, facilitating plasma density uniformity and sheath across the surface of the substrate 106 within the processing zone 134.

In some aspects, MFC 116 configures and manages the operation of magnetic field source 138 via communication link 144. In some embodiments, the magnetic field source 138 is a coil mounted on a top plate 136 of the vacuum chamber 100 via support structure 140. In some aspects, the MFC 116 uses a magnetic field sensor 142 configured to detect a signal representing the one or more active magnetic fields. For example, the MFC 116 may use the detected signal to determine one or more of a current through the one or more magnetic field sources, the magnitude of the one or more active magnetic fields, or polarity of the one or more active magnetic fields. The determined signal representing the one or more active magnetic fields may be used by the MFC 116 for adjusting a current through the one or more magnetic field sources. Example functionalities performed by the MFC 116 using the detected signal from the magnetic field sensor 142 are discussed hereinbelow and in connection with FIG. 13. In some embodiments, sensor 142 may be placed in a horizontal plane that is parallel to a horizontal plane (e.g., surface 128) of the substrate 106. Additionally, sensor 142 may be placed so that a vertical axis of the sensor (e.g., an axis that is orthogonal to the horizontal plane) is parallel with (or coincides with) a vertical axis (e.g., a center vertical axis) of the substrate 106.

In an example embodiment, the MFC 116 is configured to apply RF power (e.g., via the RF generator 118) between the upper electrode 104 and the lower electrode 108 of the vacuum chamber 100 to generate plasma 102 within the processing zone 134 using a process gas. The MFC 116 is further configured to control current through the magnetic field source 138 during the processing of the substrate 106, where applying the current causes generation of the one or more active magnetic fields 130 through the processing zone 134 (resulting in improved plasma density uniformity and mitigation of systematic twisting of slit profiles in the substrate 106). In some aspects, the current is based on a target value corresponding to at least one characteristic of the one or more active magnetic fields 130. For example, the at least one characteristic of the one or more active magnetic fields 130 includes one or more of coil current associated with a coil of at least one coil (e.g., the at least one coil is configured as the magnetic field source 138), magnetic field magnitude of the one or more active magnetic fields 130, and magnetic field polarity of the one or more active magnetic fields 130.

In some embodiments, the target value corresponding to the at least one characteristic of the one or more active magnetic fields 130 (e.g., current, magnitude, or polarization) may be determined a priori (e.g., before using the vacuum chamber for processing the substrate 106) based on known characteristics associated with substrate processing within the vacuum chamber 100 (e.g., degree of systematic twisting associated with a plurality of slit profiles in the substrate). In this regard, the MFC 116 is further configured to detect the degree of systematic twisting associated with the plurality of slit profiles in the substrate. In some aspects, the degree of systematic twisting may be based on one or more measurements of the plurality of slit profiles. In some embodiments, the degree of systematic twisting may be determined a priori (e.g., based on analysis of a processed substrate). In other aspects, the MFC 116 is configured to determine a degree of systematic twisting dynamically (e.g., during the processing of the substrate 106). In this regard, the target value corresponding to the at least one characteristic of the one or more active magnetic fields 130 may be adjusted dynamically, which may result in the MFC 116 adjusting the current of the magnetic field source 138 dynamically as well. In other aspects, the current of the magnetic field source 138 is set before substrate processing and is maintained constant throughout the substrate processing.

In an example embodiment, the MFC 116 is further configured to adjust the current through the magnetic field source 138 based on the degree of systematic twisting. In some aspects, a distance between the surface 105 of the upper electrode and a surface of the lower electrode 108 is configured based on the degree of systematic twisting. In other aspects, the MFC 116 is further configured to adjust the flow rate of the process gas based on the degree of systematic twisting. In some embodiments, the magnetic field sensor 142 is configured to detect a signal representing the one or more active magnetic fields. The detected signal may be indicative of the magnetic field magnitude of the one or more active magnetic fields, and MFC 116 is further configured to adjust a subsequent current through the at least one magnetic field source based on a difference between the magnetic field magnitude of the one or more active magnetic fields and a magnetic field magnitude corresponding to the target value. In some aspects, the detected signal is indicative of the magnetic field polarity of the one or more active magnetic fields, and MFC 116 is further configured to adjust a subsequent current through the at least one magnetic field source based on the magnetic field polarity of the one or more active magnetic fields and a magnetic field polarity corresponding to the target value. In some embodiments, the at least one magnetic field source 138 includes at least one coil of a pre-determined diameter, the at least one coil being substantially parallel to surface 128 of the substrate 106.

FIG. 2 illustrates different types of charging of substrate slit features, which can be mitigated using the disclosed techniques according to some example embodiments. Referring to FIG. 2, slit feature 200 is associated with perpendicular charging based on a negatively charged top region 202 and a positively charged bottom region 204. Slit features 206 and 208 are associated with parallel charging, where positive and negative charges are disposed on opposite vertical surfaces of the slit features.

In some aspects, perpendicular charging contributes to lateral etch (or "mouse bite"/pointy defect), as illustrated by slit feature 200 and reduces the overall efficiency of ion bombardment.

Slit feature 206 is associated with a bottom-dominated parallel charging mechanism, which contributes to systematic and random twisting, oxide contact ellipticity, ion trajectory deflection, asymmetric polymer deposition, and pushing adjacent features to merge (e.g., "mouse bite" and "beak"). Slit feature 208 is associated with a top-dominated parallel charging mechanism, which contributes to systematic twisting. Additionally, the time dependence of the top-dominated parallel charging may also change with mask consumption and type.

The illustrated perpendicular and parallel charging are caused by electron non-uniformity (e.g., non-normal angles of incidence) associated with a shaped upper electrode. Both types of charging are undesirable since parallel charging could deflect ions and perpendicular charging slows ions down, contributing to an increase in twisting and other defects in slit features. In some aspects, perpendicular and parallel charging may be mitigated using the disclosed techniques (e.g., using a flat upper electrode in combination with a magnetic field source).

FIG. 3A illustrates a vacuum chamber 300A using a flat upper electrode 302 and an ESC 306 (which may include a bottom electrode) supporting a substrate 304. As illustrated in FIG. 3A, using a flat upper electrode 302 results in normal angles of incidence for the secondary electrons 308 and a non-uniform sheath 310 associated with non-normal ion trajectories (as seen in FIG. 3B).

FIG. 3B illustrates a diagram 300B of ion non-normal incidence angles (or ion tilt) associated with the vacuum chamber of FIG. 3A, according to some example embodiments. Referring to FIG. 3B, the non-uniform sheath 310 results in ion scattering 312 and non-normal ion incidence angles, which contributes to twisting in substrate slit features.

FIG. 3C illustrates a vacuum chamber using a shaped upper electrode resulting in sheath uniformity, according to some example embodiments. Referring to FIG. 3C, vacuum chamber 300C uses a shaped (inner) upper electrode 316 and an ESC 314 (which may include a bottom electrode) supporting a substrate 304. As illustrated in FIG. 3C, using a shaped upper electrode 316 results in non-normal angles of incidence for the secondary electrons 318 and a uniform sheath 320 associated with normal ion trajectories.

In some embodiments, the disclosed techniques use the benefit of normal angles of incidence for the secondary electrons 308 associated with a flat upper electrode 302, and a magnetic field source (e.g., magnetic field source 138) to improve the sheath uniformity and obtain normal ion trajectories and optimal global ion tilt.

Figure 4B:
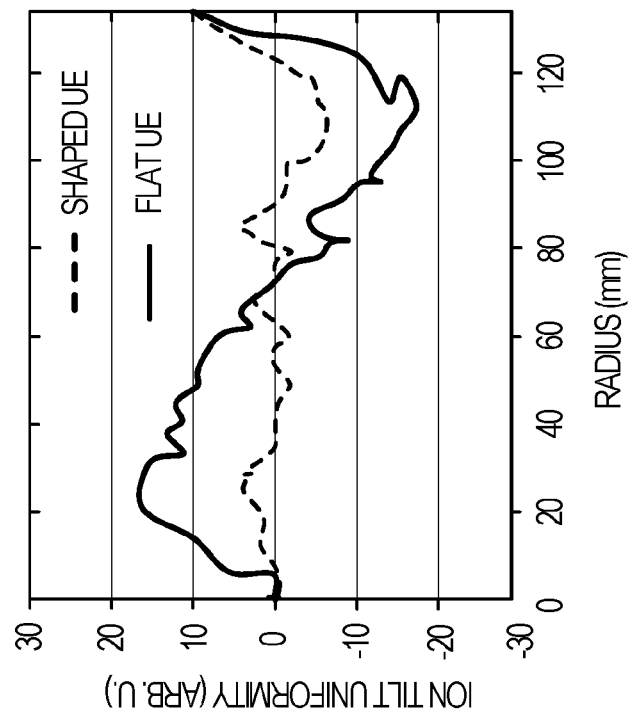
FIG. 4B illustrates a graph of ion tilt uniformity associated with a vacuum chamber using a flat or a shaped upper electrode, according to some example embodiments.
Figure 4A:
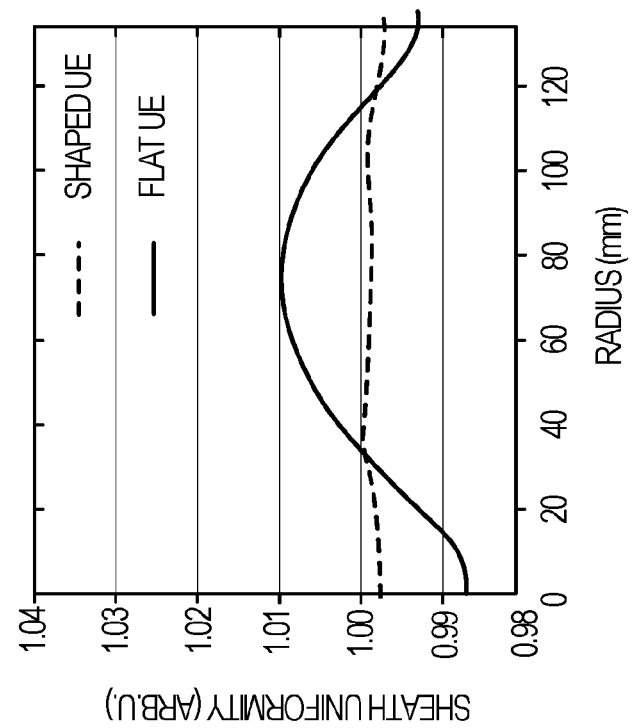
FIG. 4A illustrates a graph of sheath uniformity associated with a vacuum chamber using a flat or a shaped upper electrode, according to some example embodiments.

FIG. 4A illustrates a graph 400A of sheath uniformity associated with a vacuum chamber using a flat or a shaped upper electrode, according to some example embodiments. As illustrated in FIG. 3A and graph 400A, a flat upper electrode is associated with sheath bending (or non-uniformity), causing distorted ion incidence angles.

FIG. 4B illustrates a graph 400B of ion tilt uniformity associated with a vacuum chamber using a flat or a shaped upper electrode, according to some example embodiments. As illustrated in FIG. 4B and FIG. 3C, a shaper upper electrode results in improved ion tilt uniformity. However, a shaped upper electrode solution improves sheath bending and global ion tilt at the expense of electron uniformity (density and angle of incidence).

Figure 5:
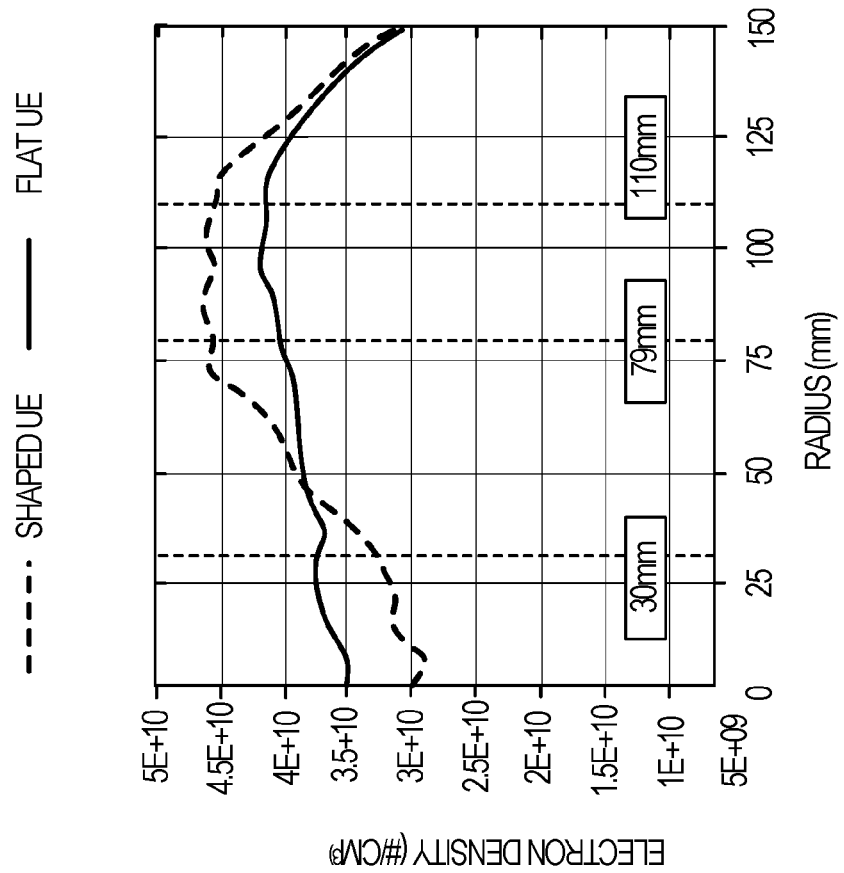
FIG. 5 illustrates a graph of electron density associated with a vacuum chamber using a flat or a shaped upper electrode, according to some example embodiments.

FIG. 5 illustrates a graph 500 of electron density associated with a vacuum chamber using a flat or a shaped upper electrode, according to some example embodiments. Referring to FIG. 5, it can be noted that improving sheath uniformity (e.g., by using a shaped upper electrode) for global tilt results in non-uniform electron density. The angular energy distribution associated with flat and shaped upper electrodes is illustrated in FIG. 6A and FIG. 6B respectively.

Figure 6A:
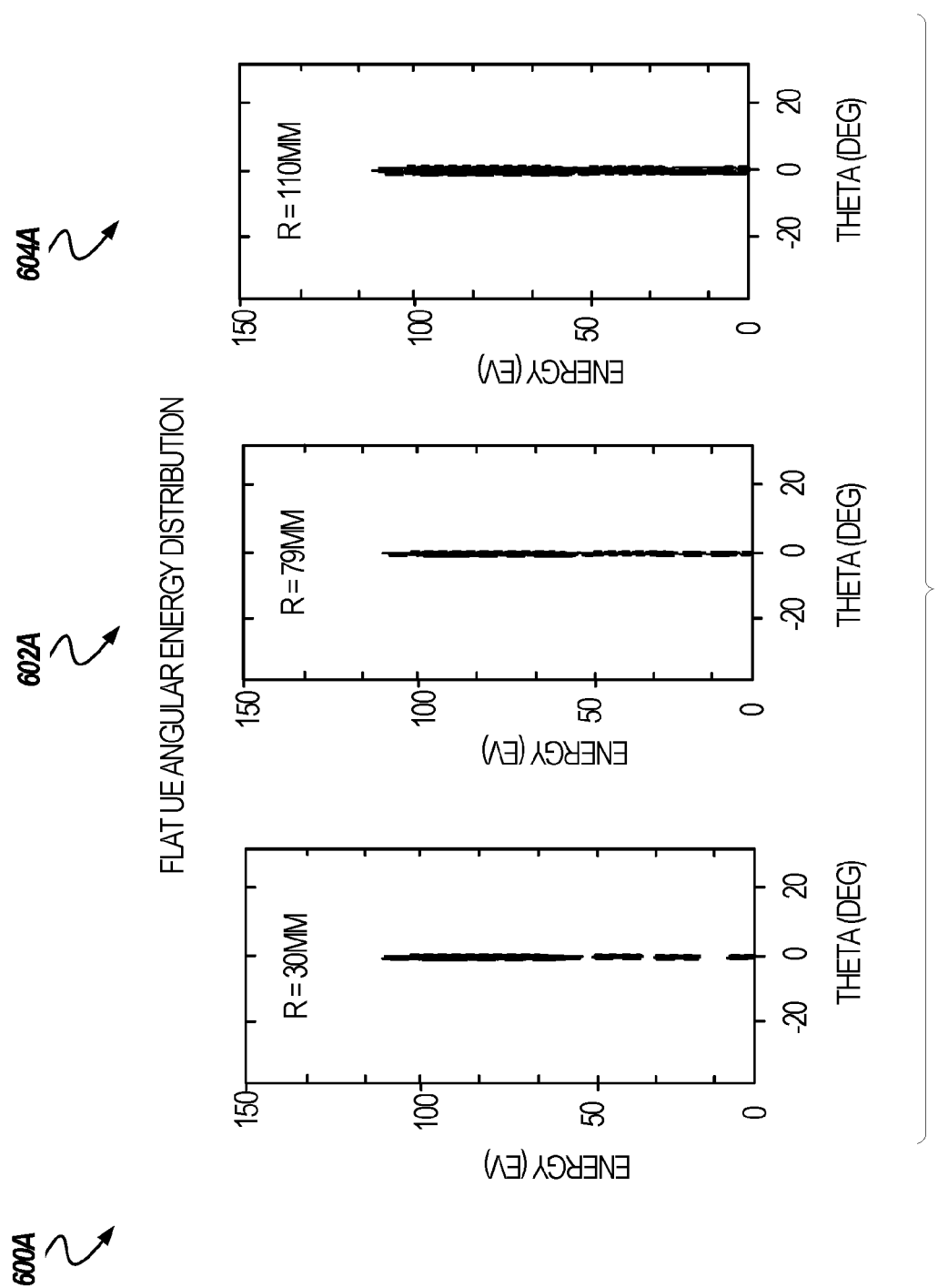
FIG. 6A illustrates graphs of electron angular energy distribution associated with a vacuum chamber using a flat upper electrode, according to some example embodiments.

FIG. 6A illustrates graphs of electron angular energy distribution associated with a vacuum chamber using a flat upper electrode, according to some example embodiments. Referring to FIG. 6A, graphs 600A, 602A, and 604A illustrate the angular energy distribution associated with using a flat upper electrode at substrate radii of 30 mm, 79 mm, and 110 mm respectively. As noted from graphs 600A-604A, the electron trajectory is perpendicular with a wide range of electron energy distribution along the diameter of the substrate when the vacuum chamber uses a flat upper electrode.

Figure 6B:
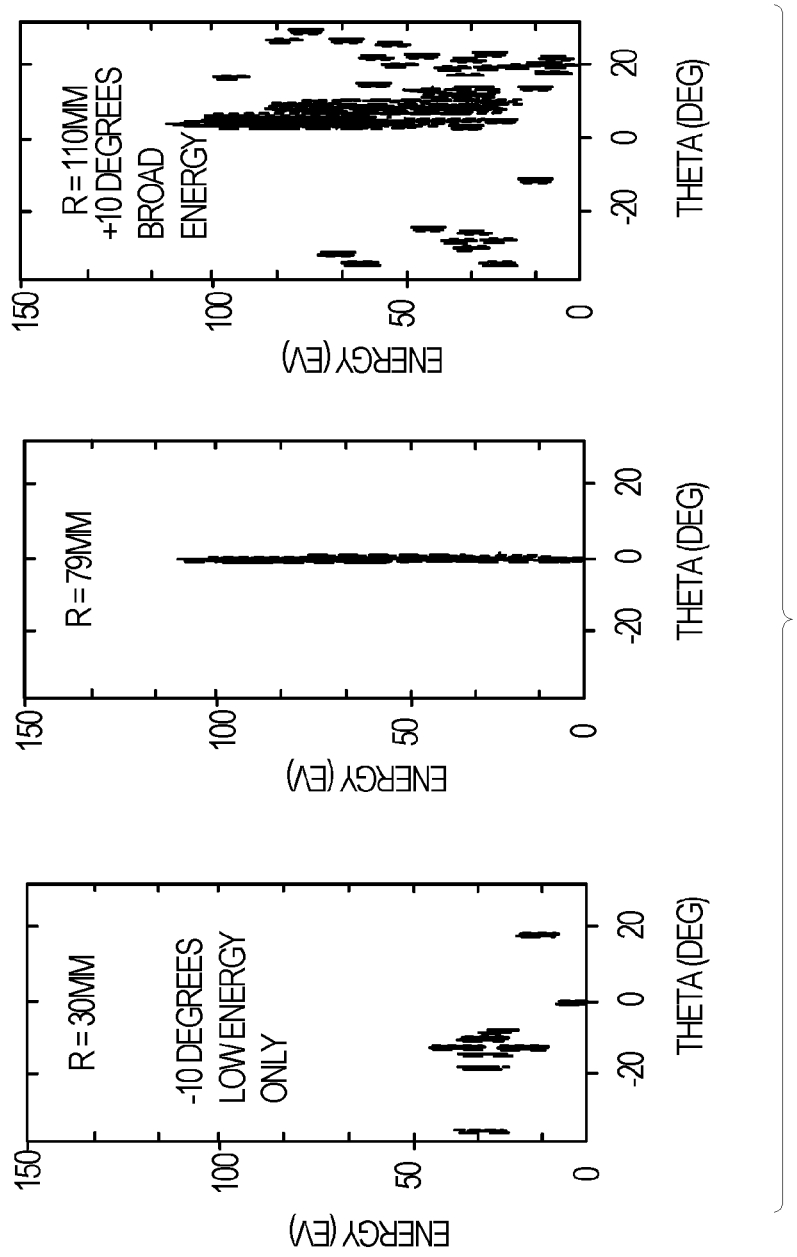
FIG. 6B illustrates graphs of electron angular energy distribution associated with a vacuum chamber using a shaped upper electrode, according to some example embodiments.

FIG. 6B illustrates graphs of electron angular energy distribution associated with a vacuum chamber using a shaped upper electrode, according to some example embodiments. Referring to FIG. 6B, graphs 600B, 602B, and 604B illustrate the angular energy distribution associated with using a shaped upper electrode at substrate radii of 30 mm, 79 mm, and 110 mm respectively. As noted from graphs 600B-604B, the electron trajectory and the range of electron energy distribution along the diameter of the substrate are non-uniform and are dependent on radius.

Figure 7:
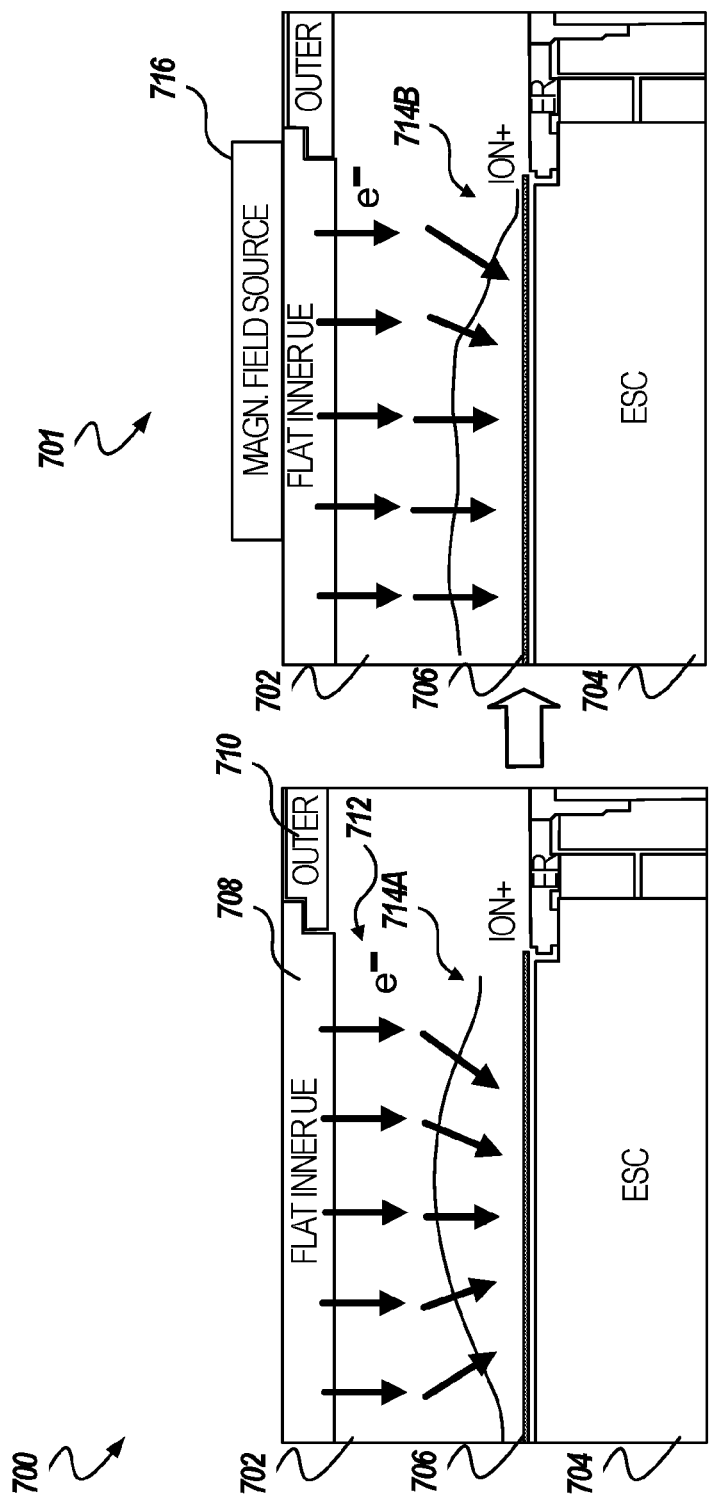
FIG. 7 illustrates a block diagram of a vacuum chamber using a magnetic field source with a flat upper electrode to improve plasma density uniformity and sheath uniformity in connection with slit profile twisting mitigation, according to some example embodiments.

FIG. 7 illustrates a block diagram 701 of a vacuum chamber 702 using a magnetic field source with a flat upper electrode to improve plasma density uniformity and sheath uniformity in connection with slit profile twisting mitigation, according to some example embodiments. Referring to FIG. 7, vacuum chamber 702 includes a flat upper electrode 708 and an ESC 704 (which may include a bottom electrode) supporting a substrate 706. In some aspects, the upper electrode 708 may be an inner upper electrode disposed in proximity to an outer upper electrode 710. As illustrated in diagram 700, using a flat upper electrode 708 results in normal angles of incidence for the secondary electrons 712 and a non-uniform sheath 714A associated with non-normal ion trajectories (as seen in FIG. 3B). In some embodiments, the plasma density uniformity and sheath uniformity are improved by using a magnetic field source 716 (as illustrated in diagram 701) used for generating one or more active magnetic fields. The one or more active magnetic fields cause improvement in the plasma density uniformity, resulting in a more uniform sheath 714B. In this regard, the disclosed techniques of using a flat upper electrode and a magnetic field source result in a combination of having normal angles of incidence for the secondary electrons 712 and a uniform sheath (with normal ion angles of incidence and global ion tilt uniformity), which substantially reduces the incidence of systematic twisting (e.g., as illustrated in FIG. 8) in substrate slit profile features during the substrate processing.

FIG. 8 is a diagram 800 illustrating improvement of slit profile twisting in relation to changes of magnetic field source current, according to some example embodiments. Referring to FIG. 8, there are illustrated different substrate processing recipes 802, 804, and 806, which may be associated with different currents of the magnetic field source (resulting in active magnetic fields of different magnitudes). As seen in FIG. 8, the systematic profile twisting 808 is reduced (from a measure of 5.31 to a measure of 2.41) as the magnetic field source current is increased from 0 A to 8 A, while the random profile twisting 810 remains substantially unchanged. The improvement in systematic twisting based on the increase in the magnetic field source current is also noted in FIG. 9, which illustrates graph 900 of systematic twisting in relation to magnetic field source current, according to some example embodiments.

Figure 10A:
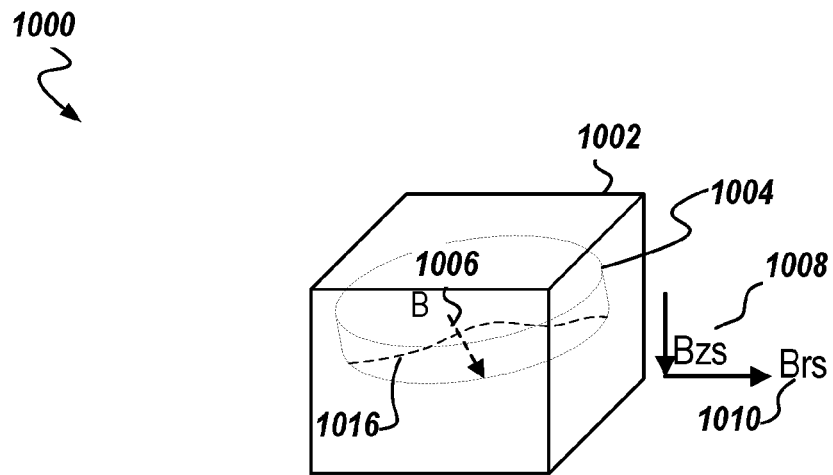
FIG. 10A illustrates a perspective view of a vacuum chamber with non-uniform plasma density within a processing zone, according to some example embodiments

FIG. 10A illustrates a perspective view 1000 of a vacuum chamber 1002 with non-uniform plasma density within a processing zone, according to some example embodiments. Referring to FIG. 10A, the vacuum chamber 1002 may use a flat upper electrode (e.g., to reduce perpendicular or parallel charging of substrate slit features), which may result in non-uniform plasma density within the processing zone 1004. The non-uniform plasma density, however, causes sheath bending resulting in a non-uniform sheath 1016, which in turn causes non-ideal (e.g., non-normal) ion trajectories contributing to twisting and other slit feature defects.

In an example embodiment, the non-uniform plasma density and the non-uniform sheath resulting from the use of a flat upper electrode can be mitigated by introducing an active magnetic field 1006 within the processing zone 1004. The active magnetic field 1006 is generated by at least one magnetic field source (e.g., as illustrated in FIGS. 11A-12) and includes one or both of an axial active magnetic field 1008 and a radial active magnetic field 1010, with corresponding magnitudes Bzs and Brs. The active magnetic field 1006 within the processing zone 1004 may be configured via the MFC 116 to result in greater plasma uniformity across the substrate surface within the processing zone 1004. More specifically, the at least one magnetic field source may be used based on the disclosed techniques to generate one or more active magnetic fields (e.g., the active magnetic field 1006) so that a target value corresponding to at least one characteristic of the one or more active magnetic fields are achieved (e.g., as discussed in connection with the functionalities of the MFC 116 described in connection with FIG. 1). Even though FIG. 10A illustrates a single active magnetic field, the disclosure is not limited in this regard and multiple active magnetic fields may also be used (e.g., multiple active magnetic fields that are parallel to the surface of the substrate, multiple active magnetic fields where one or more of the active magnetic fields are orthogonal to the surface of the substrate, etc.).

Figure 10B:
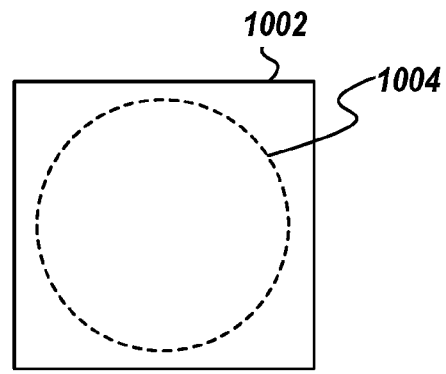
FIG. 10B illustrates a top view of the vacuum chamber of FIG. 10A, according to some example embodiments.
Figure 10C:
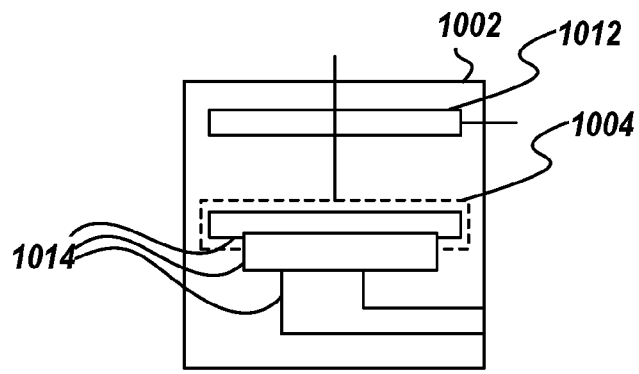
FIG. 10C illustrates a side view of the vacuum chamber of FIG. 10A, according to some example embodiments.

FIG. 10B illustrates a top view of the vacuum chamber 1002 of FIG. 10A, according to some example embodiments. FIG. 10C illustrates a side view of the vacuum chamber 1002 of FIG. 10A, according to some example embodiments. Referring to FIG. 10C, the vacuum chamber 1002 can include a top plate 1012 (which can be the same as top plate 136 in FIG. 1) as well as various facilities 1014 used in connection with processing a substrate within the processing zone 1004 (e.g., RF components and communication links, gas delivery, heaters, high-voltage clamps, substrate delivery mechanisms, etc.). The top plate 1012 can include thermo-couplers and auxiliary components to handle the gas flow, power for temperature control, mechanical components associated with gas vacuum functionalities, magnetic field sensors (e.g., sensor 142), etc.

In an example embodiment, the top plate 1012 or the facilities 1014 may be used for mounting one or more one magnetic field sources (e.g., magnetic field source 138) that can generate one or more active magnetic fields (e.g., active magnetic field 1006 including an axial active magnetic field 1008 and a radial active magnetic field 1010) to counter the non-uniformity effects of using a flat upper electrode on plasma density. In this regard, plasma density uniformity and sheath uniformity may be improved (while using a flat upper electrode) by generating the active magnetic field 1006 (e.g., by applying current through the one or more magnetic field sources) and controlling the current based on a target value corresponding to at least one characteristic of the one or more active magnetic fields (e.g., the desired current through the one or more magnetic field sources, desired polarity, or desired magnitude of the one or more active magnetic fields).

FIG. 11A illustrates a perspective view of a vacuum chamber 1102 with a coil used as a magnetic field source for generating an active magnetic field, according to some example embodiments. The coil may be a single spiral coil or multiple loops tightly wrapped together to form the single coil. Referring to FIG. 11A, the vacuum chamber 1102 (which may be the same as vacuum chamber 100) may experience non-uniform plasma density within its processing zone resulting from the use of a flat upper electrode (e.g., as discussed in connection with FIG. 1 and FIG. 10A).

In some aspects, a magnetic field source 1104 (e.g., a coil) may be configured to generate an active magnetic field 1106 within the vacuum chamber 1102. The active magnetic field 1106 may include an axial magnetic field 1110 with a magnitude Bz and a radial magnetic field 1112 with a magnitude Br. In some aspects, the active magnetic field 1106 may be configured, periodically monitored, and adjusted by a magnetic field controller (e.g., MFC 116). For example, one or more characteristics of the active magnetic field may be configured (e.g., current, polarity, magnitude, etc. for the magnetic field source 1104) to adjust the uniformity of plasma distribution within the vacuum chamber 1102.

In an example embodiment, the MFC 116 may use a magnetic field sensor (e.g., sensor 142) for detecting signals representing the active magnetic field 1106 (e.g., to determine current, polarity, or magnitude) to perform dynamic adjustments of the active magnetic field 1106. For example, the MFC 116 may adjust a current (e.g., a direct current (DC)) of the coil 1104, thereby changing the magnitude of the active magnetic field 1106 (and the corresponding magnitudes Bz and Br). In some aspects, the current may be adjusted so that the magnitude of the active magnetic field 1106 corresponds to a target value (e.g., a desired magnetic field magnitude, a desired current, or a desired polarity which are pre-configured and determined a priori) so that a uniform plasma distribution within the vacuum chamber is achieved. In other aspects, the MFC 116 may adjust different characteristics of the magnetic field source 1104 (e.g., current, magnitude, polarity, etc.) so that a desired total Bz and/or Br are achieved within the chamber to achieve better uniformity for chamber matching or change plasma uniformity to achieve a desired etch uniformity.

Figure 11B:
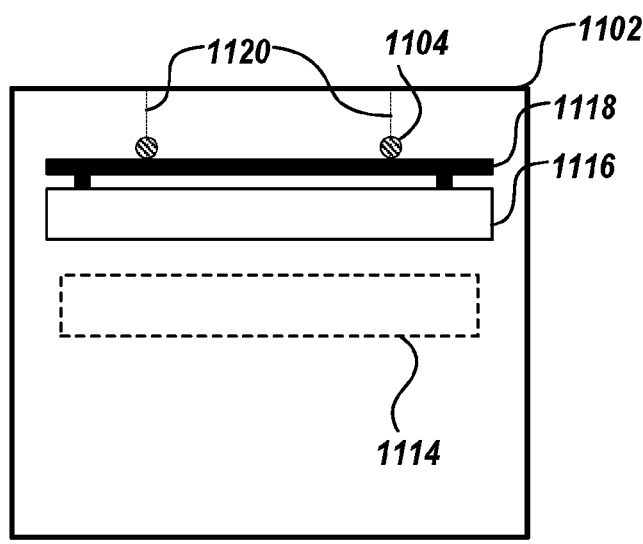
FIG. 11B is a side view of the vacuum chamber of FIG. 11A illustrating mounting options for the magnetic field source, according to some example embodiments.

FIG. 11B is a side view of the vacuum chamber 1102 of FIG. 11A illustrating mounting options for the magnetic field source 1104, according to some example embodiments. Referring to FIG. 11B, in an example embodiment, the magnetic field source 1104 (e.g., a coil) may be mounted internally, within the vacuum chamber 1102, and in proximity to the processing zone 1114. In an example embodiment, the coil 1104 may be mounted on a pedestal 1118 (e.g., support structure 140 illustrated in FIG. 1 and FIG. 12) secured to the top plate 1116 of the vacuum chamber 1102 (which can be the same as top plate 136 in FIG. 1). In an example embodiment, the coil 1104 may also be mounted to an inside surface of the vacuum chamber 1102 (e.g., a top surface as illustrated in FIG. 11B) via connections 1120.

In an example embodiment, coil 1104 may be placed outside of the vacuum chamber 1102. In an example embodiment, multiple coils may be used as magnetic field sources to generate active magnetic fields, where each coil may be positioned differently (e.g., inside or outside the vacuum chamber).

FIG. 12 illustrates an example magnetic field source mounted on a top plate of the vacuum chamber of FIG. 1, according to some embodiments. Referring to FIG. 12, the support structure 140 may include a metal housing incorporating the magnetic field source (e.g., coil) 138. In some aspects, the sensor 142 may be mounted via bracket 1202 (or another mounting mechanism) to the support structure 140 (e.g., on a surface of the support structure 140).

FIG. 13 is a flowchart of a method 1300 for processing a substrate in a vacuum chamber, according to some example embodiments. Method 1300 includes operations 1302, 1304, 1306, and 1308, which may be performed by a magnetic field controller such as MFC 116 of FIG. 1 or processor 1402 of FIG. 14. In some embodiments, processor 1402 of FIG. 14 may include processing circuitry performing functionalities of the MFC 116.

Referring to FIG. 13, at operation 1302, a process gas is supplied within a processing zone of the vacuum chamber. For example, MFC 116 enables the supply of process gas into processing zone 134 from gas source 122. At operation 1304, RF power is applied between an upper electrode and a lower electrode of the vacuum chamber to generate plasma within the processing zone using the process gas. The upper electrode is disposed within the vacuum chamber and includes a surface that is substantially parallel to a surface of the substrate when the substrate is positioned within the vacuum chamber. For example, MFC 116 applies RF power between the upper electrode 104 and the lower electrode 108 using the RF generator 118. Additionally, the upper electrode 104 includes at least one surface (e.g., surface 105) that is parallel to a surface 128 of the substrate 106.

At operation 1306, a current is applied through at least one magnetic field source to generate one or more active magnetic fields through the processing zone of the vacuum chamber. For example, MFC 116 applies current through the magnetic field source 138 to generate one or more active magnetic fields 130 through the processing zone 134. At operation 1308, the current through the at least one magnetic field source is controlled (e.g., by the MFC 116) during the processing of the substrate, where the current is based on a target value corresponding to at least one characteristic of the one or more active magnetic fields.

FIG. 14 is a block diagram illustrating an example of a machine 1400 upon or by which one or more example process embodiments described herein may be implemented or controlled. In alternative embodiments, the machine 1400 may operate as a standalone device or may be connected (e.g., networked) to other machines. In a networked deployment, the machine 1400 may operate in the capacity of a server machine, a client machine, or both in server-client network environments. In an example, the machine 1400 may act as a peer machine in a peer-to-peer (P2P) (or other distributed) network environment. Further, while only a single machine 1400 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, several components, or mechanisms. Circuitry is a collection of circuits implemented in tangible entities that include hardware (e.g., simple circuits, gates, logic). Circuitry membership may be flexible over time and underlying hardware variability. Circuitries include members that may, alone or in combination, perform specified operations when operating. In an example, the hardware of the circuitry may be immutably designed to carry out a specific operation (e.g., hardwired). In an example, the hardware of the circuitry may include variably connected physical components (e.g., execution units, transistors, simple circuits) including a computer-readable medium physically modified (e.g., magnetically, electrically, by the moveable placement of invariant massed particles) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In some aspects, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 1400 may include a hardware processor 1402 (e.g., a central processing unit (CPU), a hardware processor core, or any combination thereof), a graphics processing unit (GPU) 1403, a main memory 1404, and a static memory 1406, some or all of which may communicate with each other via an interlink (e.g., bus) 1408. The machine 1400 may further include a display device 1410, an alphanumeric input device 1412 (e.g., a keyboard), and a user interface (UI) navigation device 1414 (e.g., a mouse). In an example, the display device 1410, alphanumeric input device 1412, and UI navigation device 1414 may be a touch screen display. The machine 1400 may additionally include a mass storage device (e.g., drive unit) 1416, a signal generation device 1418 (e.g., a speaker), a network interface device 1420, and one or more sensors 1421, such as a Global Positioning System (GPS) sensor, compass, accelerometer, or another sensor. The machine 1400 may include an output controller 1428, such as a serial (e.g., universal serial bus (USB)), parallel, or other wired or wireless (e.g., infrared (IR), near field communication (NFC)) connection to communicate with or control one or more peripheral devices (e.g., a printer, card reader).

In an example embodiment, the hardware processor 1402 may perform the functionalities of the magnetic field controller 116 discussed hereinabove, in connection with at least FIG. 1-FIG. 13.

The mass storage device 1416 may include a machine-readable medium 1422 on which is stored one or more sets of data structures or instructions 1424 (e.g., software) embodying or utilized by any one or more of the techniques or functions described herein. The instructions 1424 may also reside, completely or at least partially, within the main memory 1404, within the static memory 1406, within the hardware processor 1402, or within the GPU 1403 during execution thereof by the machine 1400. In an example, one or any combination of the hardware processor 1402, the GPU 1403, the main memory 1404, the static memory 1406, or the mass storage device 1416 may constitute machine-readable media.

While the machine-readable medium 1422 is illustrated as a single medium, the term "machine-readable medium" may include a single medium or multiple media, (e.g., a centralized or distributed database, and/or associated caches and servers) configured to store the one or more instructions 1424.

The term "machine-readable medium" may include any medium that is capable of storing, encoding, or carrying instructions 1424 for execution by the machine 1400 and that cause the machine 1400 to perform any one or more of the techniques of the present disclosure, or that is capable of storing, encoding, or carrying data structures used by or associated with such instructions 1424. Non-limiting machine-readable medium examples may include solid-state memories and optical and magnetic media. In an example, a massed machine-readable medium comprises a machine-readable medium 1422 with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1424 may further be transmitted or received over a communications network 1426 using a transmission medium via the network interface device 1420.

Implementation of the preceding techniques may be accomplished through any number of specifications, configurations, or example deployments of hardware and software. It should be understood that the functional units or capabilities described in this specification may have been referred to or labeled as components or modules, to more particularly emphasize their implementation independence. Such components may be embodied by any number of software or hardware forms. For example, a component or module may be implemented as a hardware circuit comprising custom very-large-scale integration (VLSI) circuits or gate arrays, off-the-shelf semiconductors such as logic chips, transistors, or other discrete components. A component or module may also be implemented in programmable hardware devices such as field-programmable gate arrays, programmable array logic, programmable logic devices, or the like. Components or modules may also be implemented in software for execution by various types of processors. An identified component or module of executable code may, for instance, comprise one or more physical or logical blocks of computer instructions, which may, for instance, be organized as an object, procedure, or function. Nevertheless, the executables of an identified component or module need not be physically located together but may comprise disparate instructions stored in different locations which, when joined logically together, comprise the component or module and achieve the stated purpose for the component or module.

Indeed, a component or module of executable code may be a single instruction, or many instructions, and may even be distributed over several different code segments, among different programs, and across several memory devices or processing systems. In particular, some aspects of the described process (such as code rewriting and code analysis) may take place on a different processing system (e.g., in a computer in a data center), than that in which the code is deployed (e.g., in a computer embedded in a sensor or robot). Similarly, operational data may be identified and illustrated herein within components or modules and may be embodied in any suitable form and organized within any suitable type of data structure. The operational data may be collected as a single data set or may be distributed over different locations including over different storage devices, and may exist, at least partially, merely as electronic signals on a system or network. The components or modules may be passive or active, including agents operable to perform desired functions.

ADDITIONAL NOTES & EXAMPLES

Example 1 is a substrate processing apparatus, comprising: a vacuum chamber including a processing zone for processing a substrate using plasma; an upper electrode and a lower electrode, the upper electrode disposed within the vacuum chamber and having a surface that is substantially parallel to a surface of the substrate when the substrate is positioned within the vacuum chamber; at least one magnetic field source configured to generate one or more active magnetic fields through the processing zone of the vacuum chamber; and a controller coupled to the at least one magnetic field source and the upper electrode and configured to: apply radio frequency (RF) power between the upper electrode and the lower electrode to generate the plasma within the processing zone using a process gas; and control current through the at least one magnetic field source during the processing of the substrate, the current based on a target value corresponding to at least one characteristic of the one or more active magnetic fields.

In Example 2, the subject matter of Example 1 includes, wherein the controller is further configured to detect a degree of systematic twisting associated with a plurality of slit profiles in the substrate, the degree of systematic twisting based on one or more measurements of the plurality of slit profiles.

In Example 3, the subject matter of Example 2 includes, wherein the controller is further configured to adjust the current through the at least one magnetic field source based on the degree of systematic twisting.

In Example 4, the subject matter of Examples 2-3 includes, wherein a distance between the surface of the upper electrode and a surface of the lower electrode is configured based on the degree of systematic twisting.

In Example 5, the subject matter of Examples 2-4 includes, wherein the controller is further configured to adjust a flow rate of the process gas based on the degree of systematic twisting.

In Example 6, the subject matter of Examples 1-5 includes, wherein the at least one characteristic of the one or more active magnetic fields comprises one or more of: coil current associated with at least one coil, the at least one coil configured as the at least one magnetic field source; magnetic field magnitude of the one or more active magnetic fields; and magnetic field polarity of the one or more active magnetic fields.

In Example 7, the subject matter of Example 6 includes, a magnetic field sensor configured to detect a signal representing the one or more active magnetic fields.

In Example 8, the subject matter of Example 7 includes, wherein the detected signal is indicative of the magnetic field magnitude of the one or more active magnetic fields and the controller is further configured to adjust a subsequent current through the at least one magnetic field source based on a difference between the magnetic field magnitude of the one or more active magnetic fields and a magnetic field magnitude corresponding to the target value.

In Example 9, the subject matter of Examples 7-8 includes, wherein the detected signal is indicative of the magnetic field polarity of the one or more active magnetic fields and the controller is further configured to adjust a subsequent current through the at least one magnetic field source based on the magnetic field polarity of the one or more active magnetic fields and a magnetic field polarity corresponding to the target value.

In Example 10, the subject matter of Examples 1-9 includes, wherein the at least one magnetic field source comprises at least one coil of a pre-determined diameter, the at least one coil being substantially parallel to the surface of the substrate.

Example 11 is a method of processing a substrate in a vacuum chamber, the method comprising: supplying a process gas within a processing zone of the vacuum chamber; applying radio frequency (RF) power between an upper electrode and a lower electrode of the vacuum chamber to generate plasma within the processing zone using the process gas, the upper electrode disposed within the vacuum chamber and having a surface that is substantially parallel to a surface of the substrate when the substrate is positioned within the vacuum chamber; applying current through at least one magnetic field source to generate one or more active magnetic fields through the processing zone of the vacuum chamber; and controlling the current through the at least one magnetic field source during the processing of the substrate, the current based on a target value corresponding to at least one characteristic of the one or more active magnetic fields.

In Example 12, the subject matter of Example 11 includes, detecting a degree of systematic twisting associated with a plurality of slit profiles in the substrate, the degree of systematic twisting based on one or more measurements of the plurality of slit profiles.

In Example 13, the subject matter of Example 12 includes, adjusting the current through the at least one magnetic field source based on the degree of systematic twisting.

In Example 14, the subject matter of Examples 12-13 includes, adjusting a flow rate of the process gas based on the degree of systematic twisting.

In Example 15, the subject matter of Examples 11-14 includes, wherein the at least one characteristic of the one or more active magnetic fields comprises one or more of: coil current associated with at least one coil, the at least one coil configured as the at least one magnetic field source; magnetic field magnitude of the one or more active magnetic fields; and magnetic field polarity of the one or more active magnetic fields.

In Example 16, the subject matter of Example 15 includes, detecting the magnetic field magnitude of the one or more active magnetic fields via a magnetic field sensor associated with the at least one magnetic field source; and adjusting a subsequent current through the at least one magnetic field source based on a difference between the detected magnetic field magnitude of the one or more active magnetic fields and a magnetic field magnitude corresponding to the target value.

Example 17 is a non-transitory machine-readable storage medium including instructions that, when executed by a machine, cause the machine to perform operations for processing a substrate in a vacuum chamber, the operations comprising: supplying a process gas within a processing zone of the vacuum chamber; applying radio frequency (RF) power between an upper electrode and a lower electrode of the vacuum chamber to generate plasma within the processing zone using the process gas, the upper electrode disposed within the vacuum chamber and having a surface that is substantially parallel to a surface of the substrate when the substrate is positioned within the vacuum chamber; applying current through at least one magnetic field source to generate one or more active magnetic fields through the processing zone of the vacuum chamber; and controlling the current through the at least one magnetic field source during the processing of the substrate, the current based on a target value corresponding to at least one characteristic of the one or more active magnetic fields.

In Example 18, the subject matter of Example 17 includes, the operations further comprising: detecting a degree of systematic twisting associated with a plurality of slit profiles in the substrate, the degree of systematic twisting based on one or more measurements of the plurality of slit profiles.

In Example 19, the subject matter of Example 18 includes, the operations further comprising: adjusting the current through the at least one magnetic field source based on the degree of systematic twisting.

In Example 20, the subject matter of Examples 18-19 includes, the operations further comprising: adjusting a flow rate of the process gas based on the degree of systematic twisting.

In Example 21, the subject matter of Examples 17-20 includes, wherein the at least one characteristic comprises one or more of: coil current associated with at least one coil, the at least one coil configured as the at least one magnetic field source; magnetic field magnitude of the one or more active magnetic fields; and magnetic field polarity of the one or more active magnetic fields.

Example 22 is at least one machine-readable medium including instructions that, when executed by processing circuitry, cause the processing circuitry to perform operations to implement any of Examples 1-21.

Example 23 is an apparatus comprising means to implement any of Examples 1-21.

Example 24 is a system to implement any of Examples 1-21.

Example 25 is a method to implement any of Examples 1-21.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components for example configurations may be implemented as a combined structure or component. Similarly, structures and functionality presented as a single component may be implemented as separate components. These and other variations, modifications, additions, and improvements fall within the scope of the subject matter herein.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

The claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within the scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A substrate processing apparatus, comprising:
   a vacuum chamber including a processing zone for processing a substrate using plasma;
   an upper electrode and a lower electrode, the upper electrode disposed within the vacuum chamber and having a surface that is substantially parallel to a surface of the substrate when the substrate is positioned within the vacuum chamber;
   at least one magnetic field source configured to generate one or more active magnetic fields through the processing zone of the vacuum chamber; and
   a controller coupled to the at least one magnetic field source and the upper electrode and configured to:
      apply radio frequency (RF) power between the upper electrode and the lower electrode to generate the plasma within the processing zone using a process gas; and control current through the at least one magnetic field source during the processing of the substrate, the current based on a target value corresponding to at least one characteristic of the one or more active magnetic fields;
      detect a degree of systematic twisting associated with a plurality of slit profiles in the substrate, the degree of systematic twisting based on one or more measurements of the plurality of slit profiles; and
      adjust the current through the at least one magnetic field source based on the degree of systematic twisting.

2. The apparatus of claim 1, wherein a distance between the surface of the upper electrode and a surface of the lower electrode is configured based on the degree of systematic twisting.

3. The apparatus of claim 1, wherein the controller is further configured to: adjust a flow rate of the process gas based on the degree of systematic twisting.

4. The apparatus of claim 1, wherein the at least one characteristic of the one or more active magnetic fields comprises one or more of:
   coil current associated with at least one coil, the at least one coil configured as the at least one magnetic field source;
   magnetic field magnitude of the one or more active magnetic fields; and
   magnetic field polarity of the one or more active magnetic fields.

5. The apparatus of claim 4, further comprising a magnetic field sensor configured to detect a signal representing the one or more active magnetic fields.

6. The apparatus of claim 5, wherein the detected signal is indicative of the magnetic field magnitude of the one or more active magnetic fields and the controller is further configured to:
   adjust a subsequent current through the at least one magnetic field source based on a difference between the magnetic field magnitude of the one or more active magnetic fields and a magnetic field magnitude corresponding to the target value.

7. The apparatus of claim 5, wherein the detected signal is indicative of the magnetic field polarity of the one or more active magnetic fields and the controller is further configured to:
   adjust a subsequent current through the at least one magnetic field source based on the magnetic field polarity of the one or more active magnetic fields and a magnetic field polarity corresponding to the target value.

8. The apparatus of claim 1, wherein the at least one magnetic field source comprises at least one coil of a pre-determined diameter, the at least one coil being substantially parallel to the surface of the substrate.

9. A method of processing a substrate in a vacuum chamber, the method comprising:
supplying a process gas within a processing zone of the vacuum chamber;
applying radio frequency (RF) power between an upper electrode and a lower electrode of the vacuum chamber to generate plasma within the processing zone using the process gas, the upper electrode disposed within the vacuum chamber and having a surface that is substantially parallel to a surface of the substrate when the substrate is positioned within the vacuum chamber;
applying current through at least one magnetic field source to generate one or more active magnetic fields through the processing zone of the vacuum chamber;
controlling the current through the at least one magnetic field source during the processing of the substrate, the current based on a target value corresponding to at least one characteristic of the one or more active magnetic fields;
detecting a degree of systematic twisting associated with a plurality of slit profiles in the substrate, the degree of systematic twisting based on one or more measurements of the plurality of slit profiles; and
adjusting the current through the at least one magnetic field source based on the degree of systematic twisting.

10. The method of claim 9, further comprising: adjusting a flow rate of the process gas based on the degree of systematic twisting.

11. The method of claim 9, wherein the at least one characteristic of the one or more active magnetic fields comprises one or more of:
coil current associated with at least one coil, the at least one coil configured as the at least one magnetic field source;
magnetic field magnitude of the one or more active magnetic fields; and
magnetic field polarity of the one or more active magnetic fields.

12. The method of claim 11, further comprising:
detecting the magnetic field magnitude of the one or more active magnetic fields via a magnetic field sensor associated with the at least one magnetic field source; and
adjusting a subsequent current through the at least one magnetic field source based on a difference between the detected magnetic field magnitude of the one or more active magnetic fields and a magnetic field magnitude corresponding to the target value.

13. A machine-readable storage medium including instructions that, when executed by a machine, cause the machine to perform operations for processing a substrate in a vacuum chamber, the operations comprising:
supplying a process gas within a processing zone of the vacuum chamber;
applying radio frequency (RF) power between an upper electrode and a lower electrode of the vacuum chamber to generate plasma within the processing zone using the process gas, the upper electrode disposed within the vacuum chamber and having a surface that is substantially parallel to a surface of the substrate when the substrate is positioned within the vacuum chamber;
applying current through at least one magnetic field source to generate one or more active magnetic fields through the processing zone of the vacuum chamber;
controlling the current through the at least one magnetic field source during the processing of the substrate, the current based on a target value corresponding to at least one characteristic of the one or more active magnetic fields;
detecting a degree of systematic twisting associated with a plurality of slit profiles in the substrate, the degree of systematic twisting based on one or more measurements of the plurality of slit profiles; and
adjusting the current through the at least one magnetic field source based on the degree of systematic twisting.

14. The machine-readable storage medium of claim 13, the operations further comprising: adjusting a flow rate of the process gas based on the degree of systematic twisting.

15. The machine-readable storage medium of claim 13, wherein the at least one characteristic comprises one or more of:
coil current associated with at least one coil, the at least one coil configured as the at least one magnetic field source;
magnetic field magnitude of the one or more active magnetic fields; and
magnetic field polarity of the one or more active magnetic fields.

* * * * *